(12) United States Patent
Luebben et al.

(10) Patent No.: US 11,763,853 B2
(45) Date of Patent: *Sep. 19, 2023

(54) ELECTRONIC DEVICE THAT INCLUDES A COMPOSITION THAT CAN ACTIVELY GENERATE AND RELEASE A GASEOUS OXIDIZING AGENT COMPONENT INTO AN INTERIOR SPACE OF THE ELECTRONIC DEVICE, AND RELATED SUBASSEMBLIES AND METHODS

(71) Applicant: Seagate Technology LLC, Fremont, CA (US)

(72) Inventors: Silvia De Vito Luebben, Golden, CO (US); Paul Beatty, Fort Collins, CO (US); Rory S. Goodman, Boulder, CO (US); Paul S. Tyler, Apple Valley, MN (US); Scott E. Ryun, Victoria, MN (US); Hassan Rezayat, Longmont, CO (US); Dipeshkumar J. Purani, Shakopee, MN (US); Ted McDonald, Louisville, CO (US); Kenneth Eugene Schultz, Longmont, CO (US); Michael R. Fabry, Apple Valley, MN (US); Dale Herbert Erickson, Edina, MN (US); Christopher L. Hill, Apple Valley, MN (US); Jackson W. Nichols, Belle Plaine, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,746

(22) Filed: Jan. 25, 2022

(65) Prior Publication Data

US 2022/0148626 A1 May 12, 2022

Related U.S. Application Data

(63) Continuation-in-part of application No. 17/325,980, filed on May 20, 2021, which is a continuation of
(Continued)

(51) Int. Cl.
*G11B 33/02* (2006.01)
*H05K 5/02* (2006.01)
(Continued)

(52) U.S. Cl.
CPC ........ *G11B 33/022* (2013.01); *G11B 33/1446* (2013.01); *H05B 1/0247* (2013.01);
(Continued)

(58) Field of Classification Search
CPC .............. G11B 33/022; G11B 33/1466; G11B 33/1486; G11B 33/1446; H05K 5/0217;
(Continued)

(56) References Cited

U.S. PATENT DOCUMENTS

| | | |
|---|---|---|
| 3,140,149 A | 7/1964 | Habernickel |
| 3,650,705 A | 3/1972 | Majewski |

(Continued)

FOREIGN PATENT DOCUMENTS

| | | |
|---|---|---|
| CN | 1524266 A | 8/2004 |
| CN | 1578987 A | 2/2005 |

(Continued)

OTHER PUBLICATIONS

First Chinese Office Action, and English Translation thereof, for Chinese Application No. 202010788585 3, dated Jan. 28, 2022, (15 pages).
(Continued)

*Primary Examiner* — Brian E Miller
(74) *Attorney, Agent, or Firm* — Kagan Binder, PLLC

(57) ABSTRACT

The present disclosure relates to electronic devices that include a composition that actively generates a gaseous
(Continued)

oxidizing agent component within the interior gas space of the electronic device. The present disclosure also involves related methods.

22 Claims, 24 Drawing Sheets

Related U.S. Application Data application No. 16/944,573, filed on Jul. 31, 2020, now Pat. No. 11,024,343.

(60) Provisional application No. 62/936,816, filed on Nov. 18, 2019, provisional application No. 62/884,027, filed on Aug. 7, 2019.

(51) Int. Cl.
| | | |
|---|---|---|
| *G11B 33/14* | (2006.01) | |
| *H05B 3/42* | (2006.01) | |
| *H05K 7/20* | (2006.01) | |
| *H05B 1/02* | (2006.01) | |
| *H05B 3/06* | (2006.01) | |

(52) U.S. Cl.
CPC ............... *H05B 3/06* (2013.01); *H05B 3/42* (2013.01); *H05K 5/0217* (2013.01); *H05K 7/20* (2013.01); *G11B 33/1466* (2013.01); *G11B 33/1486* (2013.01); *H05B 2203/005* (2013.01); *H05B 2203/016* (2013.01)

(58) Field of Classification Search
CPC .......... H05K 7/20; H05B 1/0247; H05B 3/06; H05B 3/42; H05B 2203/005; H05B 2203/016; H05B 3/48
See application file for complete search history.

(56) References Cited

U.S. PATENT DOCUMENTS

| | | | |
|---|---|---|---|
| 4,005,182 A | | 1/1977 | Ito et al. |
| 4,292,055 A | | 9/1981 | De Castella et al. |
| 4,323,465 A | | 4/1982 | Downey et al. |
| 4,831,475 A | | 5/1989 | Kakuda et al. |
| 4,967,295 A | | 10/1990 | Yamauchi et al. |
| 5,012,369 A | | 4/1991 | Yamauchi et al. |
| 5,059,291 A | | 10/1991 | Yamauchi et al. |
| 5,075,807 A | | 12/1991 | Inoue et al. |
| 5,096,549 A | | 3/1992 | Yamauchi et al. |
| 5,118,261 A | | 6/1992 | Yamauchi et al. |
| 5,293,286 A | | 3/1994 | Hasegawa et al. |
| 5,302,270 A | | 4/1994 | Yamauchi et al. |
| 5,392,177 A | | 2/1995 | Chainer et al. |
| 5,417,743 A | | 5/1995 | Dauber |
| 5,454,157 A | | 10/1995 | Ananth et al. |
| 6,110,533 A | | 8/2000 | Cote et al. |
| 6,317,286 B1 | | 11/2001 | Murphy et al. |
| 6,587,307 B1 | | 7/2003 | Raymond et al. |
| 7,062,387 B1 | | 6/2006 | Burns et al. |
| 7,460,333 B2 | | 12/2008 | Akamatsu et al. |
| 7,478,760 B2 | | 1/2009 | Beatty et al. |
| 7,538,972 B2 | | 5/2009 | Burts-Cooper et al. |
| 7,695,547 B2 | | 4/2010 | Smith |
| 8,094,409 B2 | | 1/2012 | Feliss et al. |
| 8,199,425 B1 | | 6/2012 | Gustafson et al. |
| 8,254,055 B2 | | 8/2012 | Brown |
| 8,451,559 B1 | | 5/2013 | Berding et al. |
| 8,885,287 B1 | | 11/2014 | Koike et al. |
| 9,058,851 B1 | | 6/2015 | Hanke |
| 9,725,530 B2 | | 8/2017 | Cheng et al. |
| 10,115,436 B1 | | 10/2018 | Zhang et al. |
| 10,424,336 B1 * | | 9/2019 | Kraus ................. G11B 33/146 |
| 10,468,071 B1 | | 11/2019 | Tasaka et al. |
| 10,566,031 B2 | | 2/2020 | Brand |
| 10,593,372 B2 | | 3/2020 | Yap et al. |
| 10,957,363 B1 | | 3/2021 | Brand |
| 11,024,343 B2 | | 6/2021 | Luebben et al. |
| 11,270,739 B1 * | | 3/2022 | Zhang ................ G11B 33/1453 |
| 2003/0179489 A1 | | 9/2003 | Bernett et al. |
| 2005/0047001 A1 | | 3/2005 | Logan |
| 2006/0066974 A1 | | 3/2006 | Akamatsu et al. |
| 2006/0171065 A1 | | 8/2006 | Akamatsu et al. |
| 2006/0272507 A1 | | 12/2006 | Johnson |
| 2009/0244769 A1 | | 10/2009 | Dai et al. |
| 2009/0296271 A1 | | 12/2009 | Feliss et al. |
| 2011/0149435 A1 | | 6/2011 | Brown |
| 2012/0031431 A1 | | 2/2012 | Carlson et al. |
| 2013/0044391 A1 | | 2/2013 | Brown |
| 2014/0377143 A1 | | 12/2014 | Ellison et al. |
| 2015/0096884 A1 | | 4/2015 | Shealy et al. |
| 2015/0294691 A1 | | 10/2015 | Inaba et al. |
| 2016/0104515 A1 | | 4/2016 | Strange |
| 2016/0336045 A1 | | 11/2016 | Beatty et al. |
| 2019/0318767 A1 * | | 10/2019 | Brand ..................... G06F 1/182 |
| 2019/0365939 A1 | | 12/2019 | McGinnis et al. |
| 2021/0043232 A1 | | 2/2021 | Luebben et al. |
| 2021/0287719 A1 | | 9/2021 | Luebben et al. |
| 2022/0406341 A1 * | | 12/2022 | Luebben ............. H05K 5/0217 |

FOREIGN PATENT DOCUMENTS

| | | |
|---|---|---|
| CN | 101447191 A | 6/2009 |
| CN | 101552027 A | 10/2009 |
| CN | 102194465 A | 9/2011 |
| CN | 102403016 A | 4/2012 |
| CN | 103187074 A | 7/2013 |
| CN | 105047217 A | 11/2015 |
| JP | S557164431 A | 10/1982 |

OTHER PUBLICATIONS

Li Jingui et al., "Corrosion and Corrosion Control Manual," National Defense Industry Press, p. 343, 1988, (2 pages).
Unpublished Utility U.S. Appl. No. 17/891,316, filed Aug. 19, 2022 (Not attached).
Zhengqiang et al., "Analysis of the Mechanical Properties of Head /Disk Interface in Air-Helium Gas Mixtures," Journal of South China University of Technology, vol. 47, No. 3, pp. 44-52, Mar. 2019, (9 pages).
First Chinese Office Action, and English Translation thereof, for corresponding Chinese Application No. 202010789195.8, dated Jun. 28, 2021, (15 pages).
Medvedev et al., "Stabilization of Zinc Peroxide in the Combined Process of Granulation and Encapsulation," Theoretical Foundations of Chemical Engineering, vol. 52, No. 4, 2018, (6 pages).
Shames et al., "Unusual Stabilization of Zinc Peroxide by Manganese Oxide: Mechanistic Understanding by Temperature-Dependent EPR Studies," The Journal of Physical Chemistry, vol. 123, Issue 34, pp. 20884-20892. Jul. 18, 2019, (9 pages).
Unpublished Utility U.S. Appl. No. 17/171,047, filed Feb. 9, 2021 (Not attached).

* cited by examiner

ELECTRONIC DEVICE THAT INCLUDES A COMPOSITION THAT CAN ACTIVELY GENERATE AND RELEASE A GASEOUS OXIDIZING AGENT COMPONENT INTO AN INTERIOR SPACE OF THE ELECTRONIC DEVICE, AND RELATED SUBASSEMBLIES AND METHODS

CROSS-REFERENCE TO RELATED APPLICATIONS

This application is a continuation-in-part patent application of nonprovisional patent application Ser. No. 17/325,980 filed on May 20, 2021, which is a continuation patent application of nonprovisional patent application Ser. No. 16/944,573 filed on Jul. 31, 2020, now U.S. Pat. No. 11,024,343, which in turn claims the benefit of commonly owned provisional applications: Ser. No. 62/884,027, filed on Aug. 7, 2019; and Ser. No. 62/936,816, filed on Nov. 18, 2019; wherein the entirety of each of said applications is incorporated herein by reference.

The present application is related to patent application having application Ser. No. 16/944,516 filed on Jul. 31, 2020, by Luebben et al., titled "ELECTRONIC DEVICE THAT INCLUDES A COMPOSITION THAT CAN RELEASE AND OPTIONALLY GENERATE A GASEOUS OXIDIZING AGENT COMPONENT INTO AN INTERIOR SPACE OF THE ELECTRONIC DEVICE, AND RELATED SUBASSEMBLIES AND METHODS", wherein the entirety of said nonprovisional application is incorporated herein by reference.

BACKGROUND

The present disclosure relates to electronic devices such as data storage devices like hard disk drives (HDDs) (internal and/or external), network attached storage (NAS), and the like. There is a continuing need to solve problems related to maintaining internal, electronic drive components in as-built conditions for the service life of the electronic device.

SUMMARY

The present disclosure includes embodiments of an electronic device including:
a) a housing having an interior gas space;
b) one or more electronic components disposed within the housing;
c) a composition that can actively generate a gaseous oxidizing agent component, wherein the composition comprises a stabilizer that can slow down the generation of the gaseous oxidizing agent; and
d) a generating device configured to actively cause the composition to generate the gaseous oxidizing agent component.

The present disclosure also includes embodiments of an electronic device including:
a) a housing having an interior gas space;
b) one or more electronic components disposed within the housing;
c) a composition that can actively generate a gaseous oxidizing agent component; and
d) a generating device configured to actively cause the composition to generate the gaseous oxidizing agent component, wherein the generating device includes one or more heating elements in thermal contact with the composition, wherein the one or more heating elements are in electrical communication with a power source that is configured to apply power to the one or more heating elements to heat the composition to a temperature that causes the composition to generate the gaseous oxidizing agent component.

The present disclosure also includes embodiments of an electronic device including:
a) a housing having an interior gas space;
b) one or more electronic components disposed within the housing;
c) a composition that can actively generate a gaseous oxidizing agent component; and
d) a generating device configured to actively cause the composition to generate the gaseous oxidizing agent component, wherein the composition is disposed within a housing, wherein the housing comprises at least a first wall and a concentric, second wall defining a space between the first wall and the second wall, wherein the housing is thermally insulating, and, optionally, wherein the housing is disposed within an environmental control module.

The present disclosure also includes embodiments of an electronic device including:
a) a housing having an interior gas space;
b) one or more electronic components disposed within the housing;
c) a composition that can actively generate a gaseous oxidizing agent component; and
d) a generating device configured to actively cause the composition to generate the gaseous oxidizing agent component, wherein the composition has been pre-conditioned by a process comprising heating the composition to a temperature that causes the composition to generate a gaseous oxidizing agent component, wherein the heating occurs for a time period that corresponds to an increase in rate of weight loss of the composition for a temperature from a first rate of weight loss of the composition to a second rate of weight loss of the composition, wherein the second rate of weight loss is less than a maximum rate of weight loss at the temperature.

The present disclosure also includes embodiments of an electronic device including:
a) a housing having an interior gas space;
b) one or more electronic components disposed within the housing;
c) a composition that can generate a gaseous oxidizing agent component; and
d) a generating device configured to actively cause the composition to generate the gaseous oxidizing agent component, wherein the generating device includes at least one metal-air battery that is in electrical communication with a power source that is configured to apply power to the metal-air battery according to a predetermined time interval to recharge the metal-air battery to generate the gaseous oxidizing agent component.

DETAILED DESCRIPTION

Figure 1B:
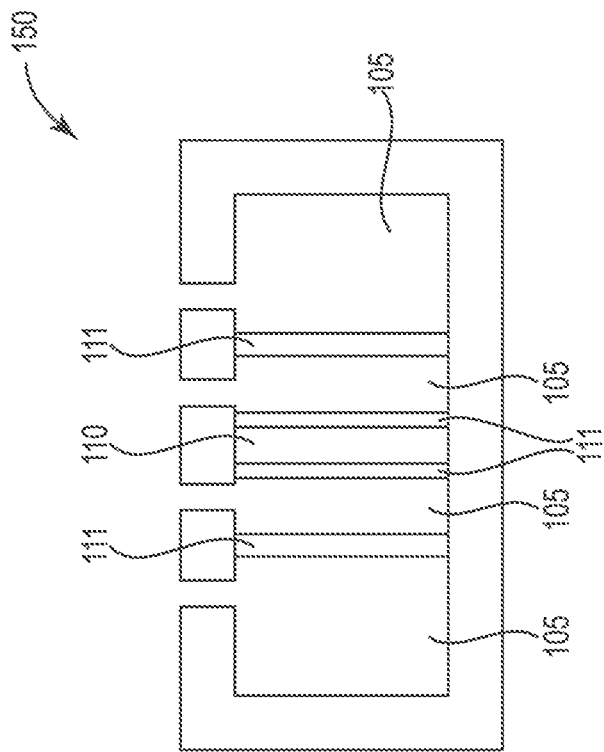
FIG. 1B shows a cross-section schematic of another embodiment of a device for actively generating a gaseous oxidizing agent component.

The present disclosure relates to electronic devices that include a composition that is actively controlled to generate a gaseous oxidizing agent component within the interior gas space of the electronic device. The present disclosure also relates to electronic devices that include a container that includes a gaseous oxidizing agent component in a manner that the gaseous oxidizing component can transfer from the container to the interior gas space of the electronic device.

A wide variety of electronic devices having an interior space and one or more electronic components disposed within the interior space can benefit by having a container that includes a gaseous oxidizing agent component that can be released into the interior space and/or a composition that generates a gaseous oxidizing agent component after the electronic device is assembled and during at least a portion of its service life as described herein. In some embodiments, an electronic device is a data storage device. Non-limiting examples of data storage devices include hard disk drives (internal and/or external), network attached storage (NAS), and the like. Examples of hard disc drives are reported in U.S. Pat. No. 7,478,760 (Beatty et al.) and U.S. Pat. No. 7,695,547 (Smith), wherein the entireties of said patents are incorporated herein by reference.

For example, in some embodiments, for desirable performance and reliability characteristics in disk drives an operating atmosphere can include an initial fill of a gas mixture that includes primarily helium gas and a second minor gas fraction consisting of a gaseous oxidizing agent component (oxidizer) for the entire operational life of the drive. The purpose of the primarily helium environment is to reduce gas turbulence induced vibration of the drives internal components to facilitate track follow capability across disk track widths of 100 nm or less. The second minor gas component, the gaseous oxidizing agent component can oxidize inorganic and/or organic materials and limit their accumulation on one or more components within the interior of an electronic device such as a hard disk drive as desired (e.g., to maintain one or more electronic components within the interior space in as-built conditions). Chemical reactions between the gaseous oxidizing agent component and inorganic and/or organic materials is believed to result in the formation of gaseous by-products that are free to transport away.

It has been observed that the concentration of an initial quantity of oxygen gas included in welded HDDs can unfortunately decrease over time. The rate of decrease of oxygen concentration can depend on a variety of factors such as one or more drive operating conditions. The loss of oxygen over time can be attributed to chemical reactions between oxygen and internal drive components. Such internal drive components include, but are not limited to, the recording media, activated carbon, and ferrous metal components. The measured rate of loss of oxygen is expected to result in the oxygen concentration dropping below a desired concentration over the service life of the HDD.

The interior gas space of an electronic device can include helium gas to maintain sufficient vibration mitigation. As the fraction of helium is decreased (e.g., from 100%), the vibrational performance of the drive mechanics can degrade, suggesting it can be beneficial to limit the non-helium oxidizing gas constituents to a minimum mole fraction as desired. the helium gas is present in the interior gas space at a mole fraction of 99 percent or less based on the total gas in the interior gas space (e.g., from 80 to 99 percent, from 80 to 95 percent, from 85 to 95 percent, or even from 85-90 percent).

The interior gas space of an electronic device can have a nominal relative humidity of 20% or less at 25° C., 15% or less at 25° C., 10% or less at 25° C., 5% or less at 25° C., or even 1% or less at 25° C.

In some embodiments, an electronic device can be a hermetically sealed electronic device, which can be defined by, e.g., the amount of gas that leaks from the electronic device after it has been sealed (e.g., a welded HDD). In some embodiments, the interior gas space includes helium gas and the hermetically sealed electronic device has a helium leak rate of $50 \times 10^{-8}$ atm (atmosphere) cc (cubic centimeter)/second or less at 25° C.; $20 \times 10^{-8}$ atm cc/second or less, $10 \times 10^{-8}$ atm cc/second or less; $5 \times 10^{-8}$ atm cc/second or less at 25° C.; or even $4.2 \times 10^{-8}$ atm cc/second or less at 25° C.

The present disclosure involves maintaining the concentration of a gaseous oxidizing agent component in the interior gas space of an electronic device within a desirable range over a variety of operating conditions and for a given time period (e.g., throughout the life of the drive). Maintaining a gaseous oxidizing agent component has the advantage of maintaining the helium mole fraction at a desired level to help provide a favorable mechanical vibration environment, while at the same time maintaining a desired supply of a gaseous oxidizing agent component to reduce or prevent performance impairment of one or more internal, electronic drive components due to insufficient oxidizer supply.

According to one aspect, the present disclosure includes approaches for actively generating a gaseous oxidizing agent component from a composition at a rate selected to maintain a desired concentration of the gaseous oxidizing agent component as described herein. As used herein, "a gaseous oxidizing agent component" includes one or more oxidizing agent species. Nonlimiting examples of oxidizing agent species include atomic oxygen, molecular oxygen, ozone, nitrous oxide, hydrogen peroxide, oxygen radical, dioxygen radicals, and mixtures thereof.

A type and amount of a composition that generates a gaseous oxidizing agent component can be selected based on one or more factors such as the target mole fraction of gaseous oxidizing agent component in the interior space of an electronic device; the temperature or range of temperatures at which the composition generates a gaseous oxidizing agent component; the operating temperature of an electronic device, which the composition will be exposed to; the service life of the electronic device; and the like. In some embodiments, the composition can be included in an electronic device that has been initially filled with a gas mixture of helium/oxidizing gas species when initially assembled.

In some embodiments, a composition that generates a gaseous oxidizing agent component is selected to be a type and in an amount to generate a gaseous oxidizing agent component so that the gaseous oxidizing agent component is maintained in the interior gas space at a mole fraction in the range from 0.1 to less than 20 mole percent based on the total gas in the interior gas space; a mole fraction in the range from 0.1 to 15 mole percent based on the total gas in the interior gas space; a mole fraction in the range from 0.1 to 10 mole percent based on the total gas in the interior gas space; a mole fraction in the range from 0.1 to 5 mole percent based on the total gas in the interior gas space; a mole fraction in the range from 0.5 to 5 mole percent based on the total gas in the interior gas space; a mole fraction in the range from 0.5 to 4 mole percent based on the total gas in the interior gas space; or even a mole fraction in the range from 1.5 to 3 mole percent based on the total gas in the interior gas space.

A composition that generates a gaseous oxidizing agent component is selected to be a type and in an amount to generate a gaseous oxidizing agent component so that the gaseous oxidizing agent component is maintained in the interior gas space at a desired mole fraction for a desired time period after the electronic device (e.g., hard disk drive) has been finally assembled and ready for service (e.g., at least a portion of the service life of the hard disk drive). In some embodiments, a composition that generates a gaseous oxidizing agent component is selected to be a type and in an amount to generate a gaseous oxidizing agent component so that the gaseous oxidizing agent component is maintained in the interior gas space at a desired mole fraction for a time period of at least two months, or even at least six months. In some embodiments, a composition that generates a gaseous oxidizing agent component is selected to be a type and in an amount to generate a gaseous oxidizing agent component so that the gaseous oxidizing agent component is maintained in the interior gas space at a desired mole fraction for a time period of up to 3 years, up to 4 years, up to 5 years, up to 6 years, up to 7 years, up to 8 years, or even up to 9 years.

According to the present disclosure, a composition can be used to actively generate the gaseous oxidizing agent component. As used herein, "active" generation of gaseous oxidizing agent component refers to the controlled application of active mechanisms such as one or more of heat, light, electrochemical, injected electrons and/or water to oxygen liberating compounds to control the rate at which oxygen is produced. Active generation of gaseous oxidizing agent component is in contrast to passive generation of gaseous oxidizing agent component, which refers to the decomposition of materials or reaction of two or more compounds through their inherent physical and chemical properties resulting in the production of a gaseous oxidizing agent component.

A composition that generates a gaseous oxidizing agent component is selected to be a type and in an amount to activate the generation a gaseous oxidizing agent component at a desired rate at one or more temperatures above typical temperatures at which an electronic device operates at, thereby actively controlling the generation of gaseous oxidizing agent component. In some embodiments, a composition that generates a gaseous oxidizing agent component is selected to be a type and in an amount to generate a gaseous oxidizing agent component at a desired rate at a temperature greater than 60° C., greater than 80° C., greater than 100° C., greater than 110° C., or even greater than 120° C. In some embodiments, a composition that generates a gaseous oxidizing agent component is selected to be a type and in an amount to generate a gaseous oxidizing agent component at a desired rate at a temperature in the range from 100° C. to 200° C., from 110° C. to 180° C., or even from 120° C. to 160° C. In some embodiments, the composition can be selected so that it generates a gaseous oxidizing agent component at a sufficient rate so that the composition can last for a desired portion of the service life of the electronic device, as described above, while at the same time produce enough gaseous oxidizing agent component while the composition is activated to generate the gaseous oxidizing agent component.

Non limiting examples of generating oxidizing agent species are illustrated below. For example, Equations 1, 2, 3 and 4 below illustrate oxidizing agent species C that can be generated according to the present disclosure. In some embodiments, the oxidizing agent species C is molecular oxygen ($O_2$) and/or nitrous oxide due to their favorable stability.

In addition to the active mechanisms mentioned above to facilitate generating oxidizing agent species, one or more chemical components can be included in the chemical composition to modify the chemical reaction. In some embodiments, the rate of decomposition of A may be accelerated chemically. For example, a catalyst may be used to accelerate the rate of decomposition of A. In some embodiments, the rate of decomposition of A may be slowed down chemically. For example, a stabilizer may be used to slow down the rate of decomposition of A.

In some embodiments, as discussed below, if the decomposition of A occurs within a housing or container disposed in an electronic device. A container may include a barrier material (e.g., film) that can control the rate of diffusion of the oxidizing agent species C to the interior space of the data storage device where it can oxidize inorganic and organic materials of transducer structures as desired.

In equations 1-4 below, A is a chemical composition for generating the oxidizing agent species C in the drive, B is a byproduct of the decomposition, C is the oxidizing agent species, D is a secondary byproduct of decomposition, and E is a catalyst, a stabilizer and/or a barrier. Non-limiting examples of by-products B and D include but are not limited to water, carbon dioxide, carbon monoxide, salts, halogenated compounds, metal oxides, sulfur containing species, nitrogen containing species (e.g., nitrogen oxides), etc., and mixtures thereof.

$$A \rightarrow B + C \quad \text{equation 1}$$

$$A \rightarrow B + C + D \quad \text{equation 2}$$

$$A + E \rightarrow B + C \quad \text{equation 3}$$

$$A + E \rightarrow B + C + D \quad \text{equation 4}$$

In some embodiments, molecular oxygen is the desired oxidizing agent species "C" as follows:

$$A \rightarrow B + O_2$$

$$A \rightarrow B + O_2 + D$$

$$A + E \rightarrow B + O_2$$

$$A + E \rightarrow B + O_2 + D$$

The chemical species A includes but is not limited to chemical compounds that contain an oxygen-oxygen bond including but not limited to hydrogen peroxide, peroxo compounds, organic peroxides, organic hydroperoxides, peracids, inorganic peroxides, inorganic hydroperoxides, percarbonates, perborates, perphosphates, persulfates, peroxyhydrate salts, oxygen inclusion compounds, certain oxides, and mixtures thereof. The chemical species A can also include compounds that complex or bind molecular oxygen, hydrogen peroxide, ozone, oxygen radical or dioxygen radical. The chemical species A can also include oxygen rich compounds such as chlorate salts, bromate salts, iodate salts, perchlorate salts, periodate slats, permanganate salts, chromate salts, etc.

In some embodiments, "A" includes calcium peroxide, magnesium peroxide, barium peroxide, zinc peroxide, cadmium peroxide, strontium peroxide, lithium peroxide, sodium peroxide, potassium peroxide, lithium nickel peroxide, potassium superoxide, sodium percarbonate, potassium percarbonate, calcium percarbonate, magnesium percarbonate, sodium perborate, sodium perborate tetrahydrate, potassium perborate, calcium perborate, magnesium perborate, potassium permanganate, sodium persulfate, potassium persulfate, and other peroxyhydrate salts such as potassium pyrophosphate peroxyhydrates and sodium sulfate-hydrogen peroxide-sodium chloride adduct, and mixtures thereof. In some embodiments, "A" includes calcium peroxide, magnesium peroxide, lithium peroxide, potassium superoxide, sodium peroxide, zinc peroxide, sodium percarbonate, sodium perborate, potassium persulfate and sodium persulfate, silver oxide, gold oxide and mixtures thereof. Peroxyhydrate salts useful in the present disclosure are described in U.S. Pat. Nos. 3,650,705, 3,140,149, 4,323,465, and 4,005,182, wherein the entirety of each patent document is hereby incorporated by reference.

In some embodiments, catalyst "E" includes one or more of transition metal oxides, transition metal compounds, manganese oxides, manganese compounds, potassium permanganate, copper oxides, copper compounds, nickel oxides, vanadium oxides, vanadium compounds, iron oxides, iron compounds, arsenic compounds, lead oxides, lead compounds, tin oxides, tin compounds, and mixtures thereof. An optional catalyst may be added to the oxygen generating compound in concentration of 0.1-10% wt. and more preferably from 1-5% wt.

As mentioned above, a composition A that decomposes into an oxidizing agent species C can be in a solid, liquid or gas form. In some embodiments, the composition is in solid form. Nonlimiting examples of decomposition reactions of a solid composition that generate a gaseous oxidizing agent include:

$$CaO_{2(s)} \rightarrow CaO_{(s)} + 0.5 O_{2(g)}$$

$$ZnO_{2(s)} \rightarrow ZnO_{(s)} + 0.5 O_{2(g)}$$

$$MgO_{2(s)} \rightarrow MgO_{(s)} + 0.5 O_{2(g)}$$

$$2KO_{2(s)} \rightarrow K_2O_{(s)} + 1.5 O_{2(g)}$$

$$Li_2O_{2(s)} \rightarrow Li_2O_{(s)} + 0.5 O_{2(g)}$$

$$Na_2CO_3 \cdot 1.5H_2O_{2(s)} \rightarrow Na_2CO_{3(s)} + 1.5 H_2O_{(g)} + 0.75 O_{2(g)}$$

$$K_2S_2O_{8(s)} \rightarrow K_2S_2O_{7(s)} + 0.5 O_{2(g)}$$

$$NaBO_3 \cdot H_2O_{(s)} \rightarrow NaBO_{2(s)} + H_2O_{(g)} + 0.5 O_{2(g)}$$

A nonlimiting example of a catalytic reaction (catalyst=$MnO_{2(s)}$) includes the following:

$$CaO_{2(s)} + 0.05 MnO_{2(s)} \rightarrow CaO_{(s)} + 0.5 O_{2(g)} + 0.05 MnO_{2(s)}$$

$$Li_2O_{2(s)} + 0.05 V_2O_{3(s)} \rightarrow Li_2O_{(s)} + 0.5 O_{2(g)} 0.05 V_2O_{3(s)}.$$

An example of selecting a composition A that decomposes into an oxidizing agent species C was illustrated with zinc peroxide. Thermogravimetric analysis (TGA) was performed on zinc peroxide by heating zinc peroxide at a rate of 10 C/min under nitrogen (25 mL/min) in a TA 5500 Thermogravimetric Analyzer. The data showed that the sample decomposed at 200° C. Thermal Desorption-Mass Spectroscopy (TD-MS) of the samples heated in helium flow at 10 C/min. showed the sample of zinc peroxide decomposed to give the desired oxygen as the major component together with some amounts of water and traces of carbon dioxide. Data was also generated to show the rate of weight loss of ZnO2 when heated at 100° C., 120° C. and 140° C. as well as oxygen release from zinc peroxide when heated at 130° C. To help actively control the release of oxygen into a hard disk drive interior gas space, zinc peroxide could be disposed inside a disk drive with a heater since it decomposes at a temperature above typical operating temperatures of a hard disk drive.

In some embodiments, as illustrated by the equations 5-8 below, the chemical composition that generates an oxidizing agent species is a mixture of two or more chemical species F and G that react with each other to generate the oxidizing agent species C.

$$F + G \rightarrow B + C \quad \text{equation 5}$$

$$F + G \rightarrow B + C + D \quad \text{equation 6}$$

$$F + G + E \rightarrow B + C \quad \text{equation 7}$$

$$F + G + E \rightarrow B + C + D \quad \text{equation 8}$$

where F and G are reactants that when reacting with each other generate an oxidizing agent species C in the electronic device (e.g., hard disk drive), B is a byproduct of the reaction, C is an oxidizing agent species, D is a secondary product of reaction, and E is either a catalyst a stabilizer or a barrier. As mentioned above, F and G can each independently be in the form of a solid, liquid or gas state. In some embodiments, the chemical composition F that generates an oxidizing agent species C reacts with a gaseous or liquid species G to produce an oxidizing agent species C. Depending on the conditions (e.g., temperature and pressure) within the interior of an electronic device (e.g., hard disk drive), B, C, and D can each independently be in the form of a solid, liquid, or gas.

F and G can each be selected to provide a desirable rate of reaction and generate a desirable concentration of the gaseous oxidizing agent component. In some embodiments, at least one reactant comprises at least one peroxide. In some embodiments, a first reactant is chosen from calcium peroxide, lithium peroxide, sodium peroxide, potassium peroxide, sodium chlorate and mixtures thereof. In some embodiments, a second reactant is chosen from liquid water, gaseous water, gaseous carbon dioxide, solid iron and mixtures thereof. Nonlimiting examples of reactive systems are illustrated as follows:

$$CaO_{2(s)}+CO_{2(g)} \rightarrow CaCO_{3(s)}+0.5O_{2(g)}$$

$$Li_2O_{2(s)}CO_{2(g)} \rightarrow Li_2CO_{3(s)}+0.5O_{2(g)}$$

$$CaO_{2(s)}+H_2O_{(l)} \rightarrow Ca(OH)_{2(s)}+0.5O_{2(g)}$$

$$Li_2O_{2(s)}+H_2O_{(l)} \rightarrow 2Li(OH)_{(s)}+0.5O_{2(g)}$$

$$Na_2O_{2(s)}+H_2O_{(l)} \rightarrow 2Na(OH)_{(s)}+0.5O_{2(g)}$$

$$2KO_{2(s)}+H_2O_{(l)} \rightarrow 2K(OH)_{(s)}+1.5O_{2(g)}$$

$$Na_2O_{2(s)}+H_2O_{(g)} \rightarrow 2Na(OH)_{(s)}+0.5O_{2(g)}$$

$$2KO_{2(s)}+H_2O_{(g)} \rightarrow 2K(OH)_{(s)}+1.5O_{2(g)}$$

$$Na_2O_{2(s)}+CO_{2(g)} \rightarrow Na_2CO_{3(s)}+0.5O_{2(g)}$$

$$2NaClO_{3(s)}+2Fe_{(s)} \rightarrow 2NaCl_{(s)}+2FeO_{(s)}+2O_{2(g)}$$

$$K_2O_{2(s)}+H_2O_{(l)} \rightarrow 2K(OH)_{(s)}+0.5O_{2(g)}$$

In some embodiments, as similarly described above with respect to the decomposition of A, one or more of the following can be used in combination with the selection of F and G: 1) a catalyst to accelerate the reaction of F and G, 2) a stabilizer to slow down the reaction of F and G, and/or 3) a barrier film or material, to control the rate the diffusion oxidizing agent species C. For example, the rate of such reactions systems may be altered from those of pure compounds by the addition of catalyst materials, stabilizers and/or barrier films/materials to maintain the desired oxygen partial pressure inside the drive. Possible catalysts include but are not limited to transition metal oxides and compounds, manganese oxides, manganese compounds, potassium permanganate, copper oxides, copper compounds, nickel oxides, vanadium oxides, vanadium compounds, iron oxides, iron compounds, arsenic compounds, lead oxides, lead compounds, tin oxides and tin compounds.

As used herein, a "stabilizer" refers to a material that can slow down (partially inhibit) the generation of the gaseous oxidizing agent. For example, a stabilizer can slow down the reaction of a composition that can actively generate a gaseous oxidizing agent component as described herein in the context providing gaseous oxidizing agent component to the interior of an electronic device over its commercial life. A stabilizer can be in a variety of physical forms such a coating and/or a discrete ingredient.

In some embodiments, the stabilizer can be present as a coating on one or more compounds that can actively decompose to generate the gaseous oxidizing agent component and/or one or more reactants that can react with one or more other reactants to generate the gaseous oxidizing agent component. In some embodiments, a stabilizer coating can be made of material that includes one or more phosphate salts (e.g., sodium phosphate, sodium polyphosphate, and the like), one or more phosphate analogues, one or more ethylene oxide oligomers, one or more ethylene oxide polymers, and combinations thereof. Non-limiting examples of a phosphate salt according to the present disclosure include alkali-metal salts such as sodium phosphate. Alkali-metal phosphate salts include a variety of salts of an alkali metal and phosphate, where "phosphate" as used herein also includes di-, tri-, tetra-, and polyphosphates. Such salts can be anhydrous (water-free) and/or hydrated. A phosphate analogue is structurally and functionally similar to a phosphate salt used as a stabilizer according to the present disclosure. Non-limiting examples of an ethylene oxide polymer according to the present disclosure include polyethylene glycol and the like.

In some embodiments, the stabilizer can be present as a discrete ingredients in admixture with one or more compounds that can actively decompose to generate the gaseous oxidizing agent component and/or with two or more reactants that can react with each other to generate the gaseous oxidizing agent component. In some embodiments, a discrete, stabilizer ingredient can be made of material that includes one or more phosphate salts, one or more carboxylate salts, one or more sulfonate salts, one or more citrate salts, one or more bicarbonate salts, one or more permanganate salts, one or more metal oxides, one or more amides, and combinations thereof. Non-limiting examples of a bicarbonate salt according to the present disclosure include an alkali-metal salt such as sodium bicarbonate. Non-limiting examples of a metal oxide according to the present disclosure include one or more manganese oxides such as manganese (II) oxide (MnO), manganese (III) oxide ($Mn_2O_3$), and the like. Non-limiting examples of a permanganate salt according to the present disclosure include an alkali-metal salt such as potassium permanganate and the like. Non-limiting examples of an amide according to the present disclosure include acetamide and the like. In some embodiments, water can also be used as stabilizer depending on the gaseous oxidizing agent that is selected. In some embodiments, water can function as both a stabilizer and a catalyst depending on the gaseous oxidizing agent that is selected. For example, some gaseous oxidizing agents water may function as a stabilizer at the beginning of the decomposition and as a catalyst at the end decomposition.

One or more stabilizers and/or stabilizer coatings can be present in an amount that can slow down (partially inhibit) the generation of the gaseous oxidizing agent. In some embodiments, a stabilizer coating may be present in amount of 10% or less, 5% or less by weight of the coated gaseous oxidizing agent component. In some embodiments, a stabilizer coating may be present in amount in the range of 0.5-3%, or even 1-3% by weight of the coated gaseous oxidizing agent component.

In some embodiments a second chemical reaction with desired kinetics is used to produce in situ the reactant F. A non-limiting example of the in situ generation of the reactant F follows: Sodium or potassium hydrogen carbonate is decomposed to produce water and carbon dioxide; the nascent water and carbon dioxide react then in situ with potassium superoxide or lithium peroxide (shown below) to generate oxygen at the desired rate.

$$2NaHCO_{3(s)} \rightarrow Na_2CO_{3(s)}+H_2O_{(g)}+CO_{2(g)}$$

$$Li_2O_{2(s)}+H_2O_{(g)} \rightarrow 2LiOH_{(s)}+0.5O_{2(g)}$$

$$Li_2O_{2(s)}+CO_{2(g)} \rightarrow Li_2CO_{3(s)}+0.5O_{2(g)}$$

Some chemical species may exist in multiple forms for example water may exist and react in either the liquid form and/or the gas form, depending on the temperature.

In some embodiments, the active oxygen generating device comprises a reservoir containing water, an ultra-micro-pump capable of dispensing 0.01-10 microliter of water per pulse to a container with a reactive oxygen generating compound. Illustrative reactive oxygen generating compounds include potassium superoxide, potassium peroxide, sodium peroxide and lithium peroxide. An optional catalyst may be added to the oxygen generating compound in concertation of 0.1-10% wt., e.g., from 1-5% wt. Illustrative catalysts include metal oxides such as potassium permanganate, manganese oxide, cobalt oxide, copper oxide, iron oxide, vanadium oxide and combinations thereof. Illustrative reactions are as follows:

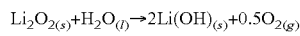

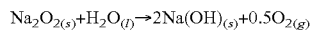

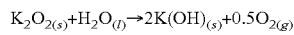

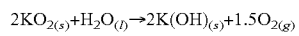

In some embodiments, an electronic device according to the present disclosure can include a generating device configured to actively decompose the composition or to cause two or more reactants to react to generate the gaseous oxidizing agent component.

Non-limiting examples of active oxygen production techniques include 1) a heater to accelerate the reaction rates of oxygen liberating compounds; 2) electrochemical cell to use voltage and electric current to stimulate oxidation/reduction reactions to produce oxygen; and 3) a device that dispenses water in a metered manner to a reactive oxygen generation compound.

With respect to heating a composition as described herein to actively cause a composition to generate gaseous oxidizing agent component, it has been discovered that one or more oxygen-generating materials, such as zinc peroxide, can possess a "memory" in regard to its oxygen generation rate. For example, it has been observed that at a fixed temperature such materials show an initial, relatively slow rate of oxygen output (e.g., ten times slower than the peak rate of oxygen output) followed by an increase in oxygen output (moles of oxygen per mole of active oxygen-generating material that remains) as the oxygen-generating material is consumed and ultimately followed by a decrease in oxygen output. While not being bound by theory, it is believed that the material has an inherent history ("remembers") of how long it has been exposed to that temperature and responds with a changing oxygen output over its long-term use in an electronic device such as an HDD.

In more detail, consider a given electrical input power to heat a composition to generate gaseous oxidizing agent component. It is assumed that a fixed power level is supplied for a constant "power-on" duration, thereby producing a fixed temperature for a given system configuration. At the outset, the composition may produce relatively little oxygen, but would produce more oxygen as the composition is exposed to the fixed temperature and increase in oxygen production rate until to a peak oxygen production rate is achieved. The peak oxygen production rate can be reached at some point during the service life of the electronic device (e.g., from 5 to 7 years, or even longer). In some embodiments, the peak oxygen production rate can be reach at about the middle of the service life of the electronic device (e.g., at about 2.5 to 3.5 years). After reaching the peak oxygen production rate, the oxygen production rate tends to decrease as the mole fraction of unconsumed oxygen-generating material decreases. Such increase and decrease of oxygen production rate is considered "unsteady," which can result in one or more disadvantages as described below.

As just described, the output of a generating device configured to actively cause the composition to generate a gaseous oxidizing agent component (e.g., oxygen) can vary considerably over the lifetime of the electronic device due to the "memory" of the composition. All else being equal, the oxygen production rate increases approximately exponentially as the temperature of the oxygen-generating composition increases. Increasing the input power can increase the temperature of the oxygen-generating composition correspondingly, which can increase the rate that oxygen is generated. Accordingly, to accommodate the previously described, unsteady nature of oxygen production rate that can be caused by the "memory" of the composition, the generating device can be configured to supply/consume relatively more electrical energy to meet oxygen demand early in the service life of the electronic device as compared to later in its service life after the composition has "aged" due to exposure to elevated temperature (discussed above). Unfortunately, the input power that may be needed to supply the appropriate power to the composition early in the service life of the electronic device may be constrained by one or more of 1) the capability of the on-board electrical power supply, 2) by power usage limits imposed by the end-user of the electronic device, 3) temperature limitations in one or more materials used to construct the generating device, or 4) undue depletion of the oxygen-generating composition if the temperature of the composition increases too much. Such constraints can create uncertainty as to whether sufficient oxygen can be created, which may cause the oxygen generator device to be sub-optimal for at least a portion if not a majority of its service life.

According to the present disclosure, at least one other solution to accommodate the "memory" of the composition (discussed above) includes "pre-conditioning" the oxygen-generating composition by exposing the composition to one or more elevated temperatures to consume an amount of the oxygen-generating composition and provide a more uniform oxygen generation profile over the service life of the electronic device. Pre-conditioning temperatures can include exposing the oxygen-generating composition to one or more temperatures for a time period so as to "skip" at least portion of the early service life of the electronic device that includes an oxygen-generating composition has not been "pre-conditioned" as described herein. Advantageously, pre-conditioning the oxygen-generating composition may cause the composition to provide a relatively more uniform oxygen generation profile when heated over the lifetime of the electronic device. In addition, pre-conditioning the oxygen-generating composition according to the present disclosure may help mitigate or avoid one or more the constraints mentioned above.

In some embodiments, the oxygen-generating composition can be pre-conditioned by heating the composition to one or more "pre-conditioning" temperatures for a time period that causes an increase in rate of weight loss of the composition for a reference temperature. In more detail, exposing the composition to one or more pre-conditioning temperatures as described herein causes the rate of weight loss of the composition to increase as determined for a reference temperature from a first rate of weight loss of the composition to a second rate of weight loss of the composition. The second rate of weight loss can be selected to be less than a maximum rate of weight loss at the reference temperature.

The reference temperature can be one or more temperatures selected that correspond to temperatures used to generate oxygen during the service life of the electronic device. Non-limiting examples of the reference temperature include a temperature from 100° C. to 160° C., or even 100° C. to 130° C.

Pre-conditioning can be performed using a wide variety of heating techniques such as an oven, which is readily and commercially available.

A pre-conditioning temperature can be selected to consume a desired amount of the composition "skip" at least portion of the early service life as described above. Determining the amount of material to consume depends on the specific composition selected (e.g., zinc peroxide) and can be determined by reference to charts that show "rate of reaction" versus conversion. Non-limiting examples of the pre-conditioning temperature include one or more temperatures from 100° C. to 160° C., or even 100° C. to 130° C.

A pre-conditioning time period can be selected as desired depending on the selected pre-conditioning temperature. Non-limiting examples of the pre-conditioning time period include a time period from 1 second to 24 hours, from 10 seconds to 5 hours, or even from 10 seconds to 2 hours.

The rate of weight loss of the composition can be reported in any desired units (e.g., percent weight loss per unit time) and can be determined using a variety of techniques such as a thermogravimetric analyzer.

Figure 1A:
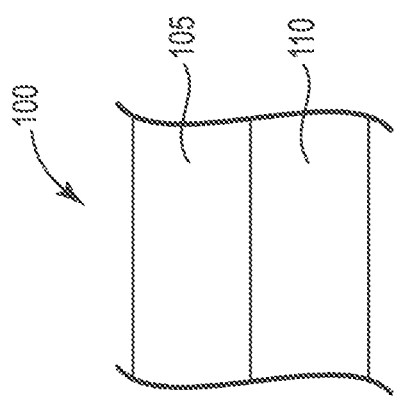
FIG. 1A shows a cross-section schematic of one embodiment of a device for actively generating a gaseous oxidizing agent component.

FIGS. 1A and 1B show a schematic representation of active devices configured to actively decompose a composition using thermal energy to generate a gaseous oxidizing agent component.

FIG. 1A shows a basic embodiment of a device 100 that includes at least one heater 110 in thermal contact with a solid composition 105. The solid composition can be any solid composition selected to decompose when heated to a given temperature as described herein to decompose the composition and generate the gaseous oxidizing agent component.

A device such as 100 can include one or more additional components such as a temperature sensing device, power source, insulation, a container or barrier materials (e.g., metal foil) to contain the components (e.g., heater) and the composition, and a membrane to allow oxygen and other gasses to escape. A thermocouple or any other temperature sensing device can be used for feedback control of temperature, which can be used for the predetermined kinetics to generate a gaseous oxidizing agent component. Also, a heater can be selected to be in electrical communication with control hardware of an electronic device so that it can operate in an on-off manner to heat the composition to generate a gaseous oxidizing agent component. A heater can be used to joule heat the oxygen generating composition. Depending on the temperature desired, heater power can be determined to provide a desirable rate of oxygen generation for a given application. It has been observed that there can be a cooling effect if a heater system is directly exposed to the interior of an electronic device such as a hard disk drive during drive operation as compared to if the heater system is enclosed in container such as an environmental control module (ECM) that is disposed inside the electronic device. Thus, there can be a power savings due to the insulating effect of the ECM, especially as the power increases. Also, it has been observed that 1% oxygen concentration and 10% oxygen concentration had relatively little impact on the temperature difference for a given power setting when the heater system was exposed to the interior of a hard disk drive.

In some embodiments, a heater includes a compound heater, which is a small furnace that may include a heater element, a temperature probe, a chamber to contain the oxygen liberating compounds. In some embodiments, a compound heater can include a gas permeable membrane to allow oxygen produced to transport to the main interior volume of the electronic device (e.g., HDD). A compound heater can be a joule heating device that operates by injecting electric current into the heating element to raise the temperature of the oxygen liberating chemical compound to the range of temperatures needed to liberate oxygen at the desired rate.

An oxygen generation device was built with 500 mg of zinc peroxide powder similar to that shown in FIG. 1A with a thermocouple in contact with the powder, all of which was wrapped in aluminum foil. The device was placed inside a hard disk drive and powered to reach outer surface temperature of the generator of 100° C. or 120° C. for different lengths of time. The composition of the gas of the drive and a control drive with no device was measured with a residual gas analyzer. It was observed that the oxygen partial pressure increased in the sealed drives after powering the zinc peroxide heater versus the control. The oxygen content of two drives increased from 1% to 10% and 18%, respectively, after the zinc peroxide heater was powered for a different length of time while the oxygen of three control drives containing with no oxygen generator remains at initial fill of 1%.

FIG. 1B shows a cross-section schematic of another embodiment of a device 150 for actively generating a gaseous oxidizing agent component. As shown in FIG. 1B, shows plates 105 of solid composition (e.g., oxide) surrounding a single heater 110. Thermally conductive material 111 can separate adjacent plates 105 and heater 110 from adjacent plates 105. A wide variety of thermally conductive material and thicknesses can be used to facilitate desirable heat transfer. Nonlimiting examples of thermally conductive material includes metal and/or ceramic materials. For example, an oxide 105 can be cast on a flexible thin ceramic fabric 111 such as alumina and wrapped around the heater 110. Relatively low heater power can activate plates 111 relatively close to the heater 110 while higher power can activate plates 111 that are further away from heater 110.

In some embodiments an electrochemical cell can be employed to actively generate a gaseous oxidizing agent component.

In some embodiments the electrochemical cell chemistry is based on the chemistry of certain metal-air batteries which generate oxygen gas during the charging cycles by reducing an oxygen-rich chemical species such as metal oxide or peroxide at the air battery cathode via a "redox" reaction. Metal-air batteries use atmospheric oxygen to react with various species to produce both electricity and metal oxide or peroxide compounds on the cell's cathode. Next during the re-charge cycle, electricity is pumped into the cell and the reverse chemical processes liberates oxygen from the cell's cathode (anode when run in recharging direction). According to the present disclosure, a metal-air battery chemistry charge cycle can be used to generate oxygen. In some embodiments, electricity can be used to generate oxygen over the course of a single "recharge" cycle that would last the entire service life (e.g., 5 years) of an electronic device such as a hard disk drive. In some embodiments, to help maintain viability of a metal-air battery to produce oxygen generator after potentially long periods of inactivity (e.g., anywhere from 1 week to 5 years), a voltage across the battery can be applied for short periods of time during periods of "inactivity" where oxygen generation is not necessarily needed in the interior space of an electronic device so as to prevent the formation of permanently inactive regions. For example, a generating device can be configured to apply a voltage across the metal-air battery if the metal-air battery has not undergone recharging for a time period of one week or more, two weeks or more, or even 4 weeks or more (e.g., from two weeks to 5 years). In some embodiments, a voltage can be applied across the battery for short periods of time such as from milliseconds up to an hour. In some embodiments, the voltage can be applied from 1 millisecond to 30 minutes, from 1 millisecond to 1 minute, or even from 1 millisecond to 1 second. Also, the voltage bias can be applied in either direction (charge and/or recharge) as desired.

In some embodiments, an electrochemical cell can include at least a cathode; an anode; a liquid or solid electrolyte, chemical composition that generates oxygen; an oxygen permeable membrane; and a power source and an assembly or case.

An oxygen producing cell can optionally include a gas permeable membrane on the cathode to allow liberated oxygen to escape the electrochemical cell. The electrochemical cell can also be electrically connected to a printed circuit board assembly (PCBA) of a hard disk drive to provide the appropriate current/voltage characteristics to control the oxygen production rate.

The particular chemistry could include oxygen generation from many potential metal oxides and peroxides. In some embodiments, oxygen generating electrochemical cells include potassium/air cells, sodium/air cells, lithium/air cells, zinc/air cells, magnesium/air cells, calcium/air cells, aluminum/air cells, iron/air cells, silicon/air cells and combinations thereof.

In some embodiments, a metal-air battery includes a first electrode and a second electrode. The first electrode can be a metal electrode that includes a metal or metal alloy thereof. The metal can be chosen from potassium, sodium, lithium, zinc, magnesium, calcium, aluminum, iron, and combinations thereof. The second electrode can be a metal oxide that can undergo a redox reaction to produce the gaseous oxidizing agent component when the metal-air battery is recharged.

Below are examples of lithium based reactions:

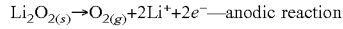
$Li_2O_{2(s)} \rightarrow O_{2(g)} + 2Li^+ + 2e^-$—anodic reaction

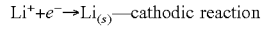
$Li^+ + e^- \rightarrow Li_{(s)}$—cathodic reaction

Figure 2:
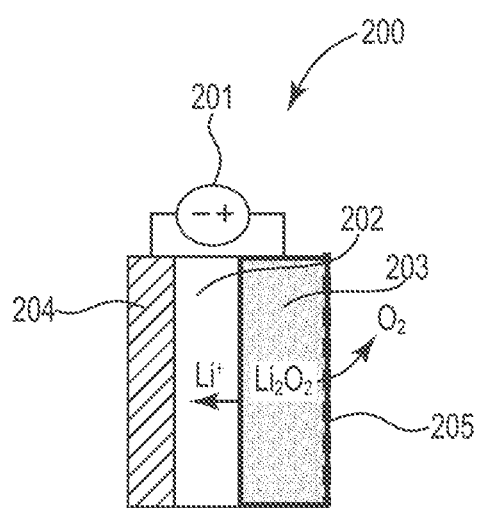
FIG. 2 shows a schematic representation of a metal air battery that can be used in an electronic device according to the present disclosure.

FIG. 2 shows a schematic representation of a metal-air battery that can be used in an electronic device according to the present disclosure to actively generate a gaseous oxidizing agent component. As shown, a metal air battery 200 includes a dc power source 201, an electrolyte (Li+) 202, a counter electrode with oxygen generating compound 203, a metal electrode 204 and an oxygen permeable membrane 205.

Metal electrode 204 can be selected as desired for a given battery 200. For example, as shown in FIG. 2, metal electrode 204 can be lithium metal. Alternatively, metal electrode 204 can be an alloy containing lithium, or any other metal (discussed above) or alloy thereof that would serve to collect the ion (referred to as "ion collector") travelling through the electrolyte 202 under the externally applied voltage bias while in the recharge mode where it recombines with one or more electrons. In some embodiments, electrode 204 can include a carbon film (e.g., a porous carbon film) where the impinging metal ion can recombine with an electron and become a metal atom electroplated to the surface of the carbon.

The oxygen generating compound at electrode 203 can also be selected as desired for a given battery 200. For example, as shown in FIG. 2, electrode is selected to be $LiO_2$ is selected to generate oxygen, e.g., because of its relatively high energy density. Other metal oxide systems can be selected as a metal/air battery 200 and can include any metal oxide that can undergo a redox reaction releasing O2 and a metal ion. If desired, battery 200 does not need to achieve an open circuit voltage after oxygen generation.

The composition and thickness of an electrolyte film such as 202 can be chosen such that the oxygen generation rate is equal to or greater than the maximum oxygen consumption rate in the drive. The electrolyte film can be a solid electrolyte or liquid (e.g., a liquid, polymer electrolyte). The vapor pressure of a liquid electrolyte at drive operating temperatures (e.g., from 0° C. to 70° C.) can be selected to avoid a loss of electrolyte greater than 1% of the electrolyte mass.

In some embodiments, a container can be disposed within an electronic device, where the container contains a composition that can be actively controlled to generate a gaseous oxidizing agent component. Optionally, the container can be initially filled with a gaseous oxidizing agent component. A container according to the present disclosure can be configured to allow gaseous oxidizing agent component to transfer from inside the container to the interior gas space of the housing to maintain the gaseous oxidizing agent component at a mole fraction as described herein above. Selecting a container and any related components can depend whether the container is initially filled with a gaseous oxidizing agent component and/or the type and amount of composition that can generate a gaseous oxidizing agent component. Selecting a container can also depend on how it is incorporated into an electronic device (e.g., HDD) to release gaseous oxidizing agent into the interior space of the electronic device. For example, whether the container is configured to passively and/or actively allow gaseous oxidizing agent component to be controllably transferred from inside the container to the interior gas space of the housing.

A container that contains a composition that can be actively controlled to generate a gaseous oxidizing agent component (and that is optionally initially filled with a gaseous oxidizing agent component) may have any desired shape including a sphere, cylinder, cone, prism, cube, pyramid or rectangular prism, and combination thereof. Furthermore, the container could be a single container or multiple separate containers.

In some embodiments, a container is disposed within an environmental control module. In other embodiments, the container is an environmental control module.

The composition that can generate a gaseous oxidizing agent component can be contained in a container in such a way that generation of oxygen gas would be actively controlled and passed through a permeable membrane to the internal hard disk drive interior volume, while containing the bulk solid materials (e.g., granules, pellets, and the like) within the container.

In some embodiments, at least a portion of the container is permeable to one or more oxidizing agents such as molecular oxygen. For example, a container can include a membrane that is permeable to the gaseous oxidizing agent component and permits the gaseous oxidizing agent component to transfer from inside the container to the interior gas space of the housing. Oxygen permeable materials for use with or as a container according to the present disclosure include polymers, plastics, rubbers, elastomers, organic coatings, thin glass, and thin ceramics. In some embodiments, such materials have oxygen permeability coefficients between 0.0001 and 1000 (mL mm)/($m^2$ d atm), e.g., oxygen permeability coefficients between 0.01 and 100 (mL mm)/($m^2$ d atm). In some detail, illustrative permeable polymers include low density polyethylene (LDPE), high density polyethylene (HDPE), polypropylene (PP), polyvinylidene fluoride (PVDF), polyvinyl alcohol, ethylene vinyl alcohol, nylon, polycarbonate, polyimide, and combinations thereof. Oxygen permeable membranes include single or multilayer films. In some embodiments, an oxygen permeable membrane can have a thickness from greater than 0 to 500 mils, from 1 to 100 mils, or even from rom 2 to 30 mils. In some embodiments, oxygen permeable materials have permeation coefficients that increase with temperature. In some embodiments, a portion of the container can be made of an oxygen impermeable material and portion of the container is made of oxygen permeable material. For example, a portion of the container can be made of an oxygen impermeable material such as metal or glass and sealed by a lid made of an oxygen permeable membrane that is fastened to the container in any desirable manner (e.g. via glue).

In some embodiments, an entire container is made of an oxygen permeable membrane. For example, such a container can be a pouch that is sealed after the composition that can generate a gaseous oxidizing agent component is place in the pouch or the container can be a vial with a threaded lid that is fastened to the container.

In some embodiments, a container may optionally contain other materials such as absorbents that capture secondary degradation products. For example, water absorbing material can be included to absorb water generated from the oxygen producing reaction. Such water can, e.g., accelerate the oxygen producing reaction and/or cause the pressure in the container to increase to an undue degree.

In some embodiments, a container can include a valve that can be actuated from a closed position to an open position to allow gaseous oxidizing agent component to flow from inside the container to the interior gas space of the housing.

Figure 3:
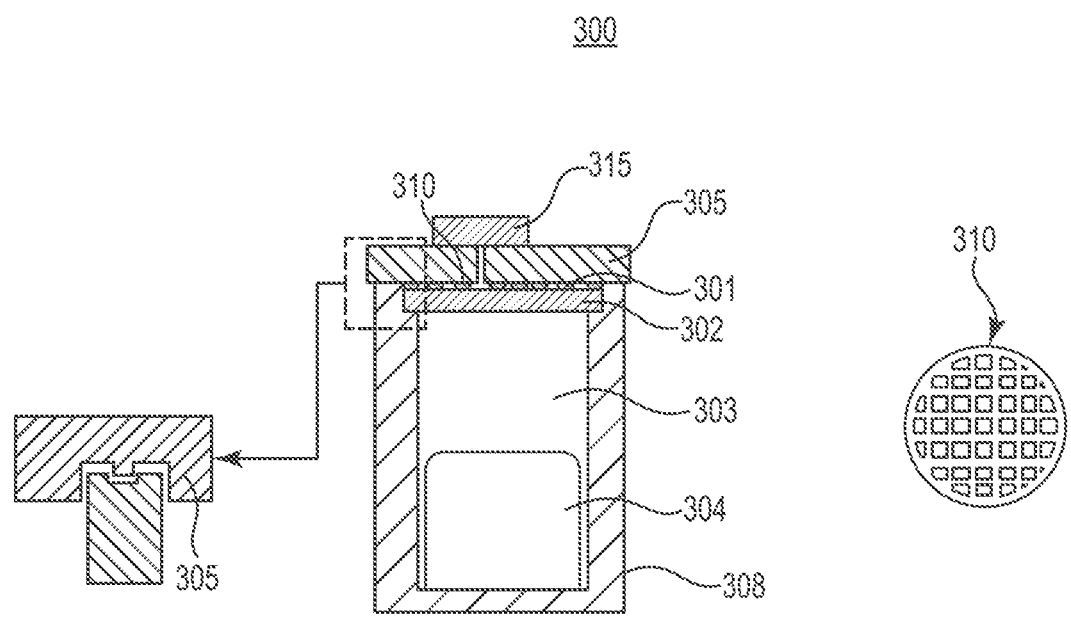
FIG. 3 shows a non-limiting example of a dual chamber container 300 with a permeation layer and micro-valve, which works like a 2-stage regulator.

FIG. 3 shows a non-limiting example of a dual chamber container 300 with a permeation layer and micro-valve, which works like a 2-stage regulator.

Container 300 includes a composition 304 that generates a gaseous oxidizing agent component. Alternatively, the container can be filled (and pressurized) with a gaseous oxidizing agent component (e.g., up to a pressure of 5-10 atm or more) to permit controlled release of oxidizing agent component from container to the interior space of an electronic device (e.g., HDD) to provide oxidizing agent component in amount that maintains the concentration of the oxidizing agent component within a desired range over a desired time period.

As shown, the composition 304 is disposed in a relatively large chamber 303, where chamber 303 functions as an oxygen reservoir. Chamber 301 is a relatively small chamber compared to chamber 303 and functions to define a release volume. Chamber 301 is separated from chamber 303 via an oxygen permeable membrane 302 selected to equilibrate chambers 303 and 301 in about 1 minute to 30 days, and more preferably in 1 day to 15 days. A nonlimiting example of membrane 302 includes polyethylene. As shown, a grid 310 is positioned between membrane 302 and cap 305 to help avoid undue plastic deformation of 302 at temperature of about 60° C. Cap 305 can be fastened to housing 308 via welding or bonding (e.g., gluing with an adhesive). As shown, cap 305 is coupled to housing 308 along an interlocking bond line. Cap 305 also includes an electro-mechanical microvalve 315 (e.g., piezoelectric or bimetallic) that can be controllably actuated (e.g., electrically activated) from a closed position to an open position for release of oxygen from container 300.

Container 300 is small enough to fit within the cavity of an electronic device such as a hard disk drive or even inside and environmental control module. Container 300 can be constructed of non-elastic hard housing 308, which can help keep the interior of an electronic device clean.

As mentioned, container 300 functions like a two-stage regulator to equalize pressure from large chamber 303 to small chamber 301 like a tiny scuba tank (in a time period of hours or days). In some embodiments, oxygen can be released from small chamber 301 into the interior of an electronic device every 4-6 weeks. For example, about 1 cubic centimeter per week of oxygen can transfer from chamber 303 to chamber 301. Oxygen can be released from chamber 301 via valve 315 relatively fast. The valve leak rate can be selected to be as low as desired (e.g., about 0.1 cubic centimeter or less per month.

In some embodiments, the oxygen generating chemical composition described above and optionally including one or more of a heater, probes, sensors, components of the electrochemical cell and/or other mechanical or electrical components can be packaged into an assembly. The assembly can be packaged in such a way to avoid corrosion of the drive components while maintaining gas exchange with the drive and/or to avoid the introduction of particulate or chemical contamination into the internal gas space of the electronic device.

FIGS. 4A-4D illustrate one non-limiting embodiment according to the present disclosure of including a composition that can generate a gaseous oxidizing agent component into a hard disk drive.

Figure 4A:
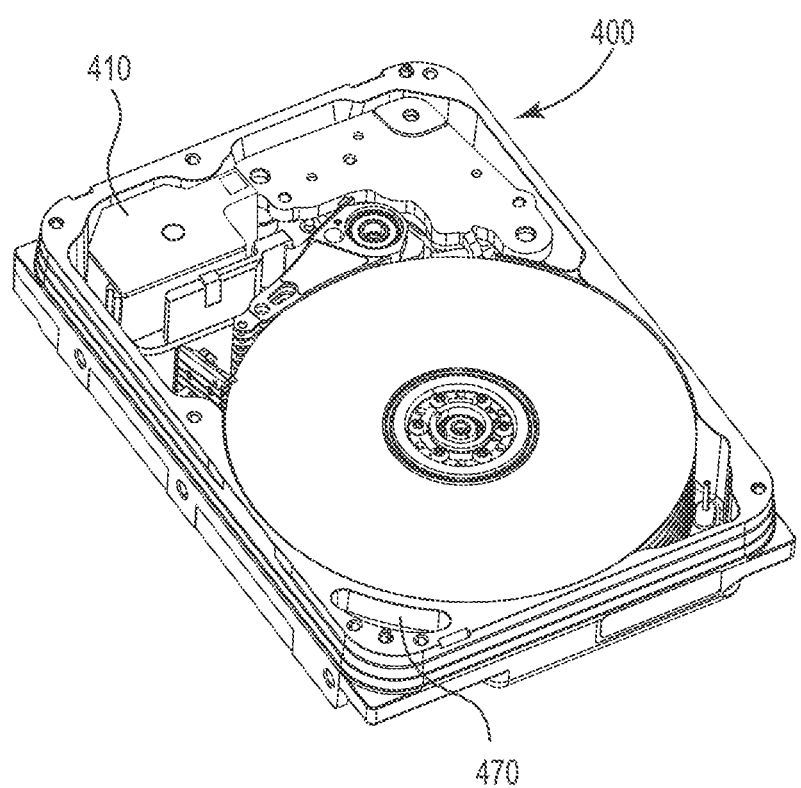
FIGS. 4A-4D illustrate one non-limiting embodiment according to the present disclosure of including a composition that can generate a gaseous oxidizing agent component into a hard disk drive

FIG. 4A shows a synoptic view of an Environmental Control Module (ECM) 410 according to the present disclosure that is installed in a hard disk drive (HDD) 400 with the top cover removed.

The ECM 410 is referred to as an "expanded" ECM because the ECM has been modified to accommodate a composition 412 that can generate a gaseous oxidizing agent component. An ECM 410 can include an ECM body, a solid composition 412 that can generate a gaseous oxidizing agent component, a desiccant 413 for absorbing moisture, a membrane (e.g., expanded polytetrafluorethylene (ePTFE)) 416 that can contain solid particulate matter within ECM while being permeable to at least oxygen gas so that oxygen gas can transfer from the ECM 410 to the interior of HDD 400 and be consumed by one or more oxidizing reactions.

Figure 4B:
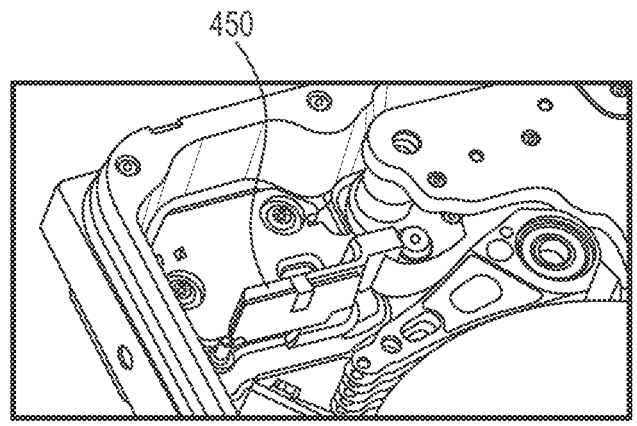

FIG. 4B is a partial view of HDD 400 with ECM 410 removed to show the vertical wall 450 of the PCC with flex connector.

Figure 4C:
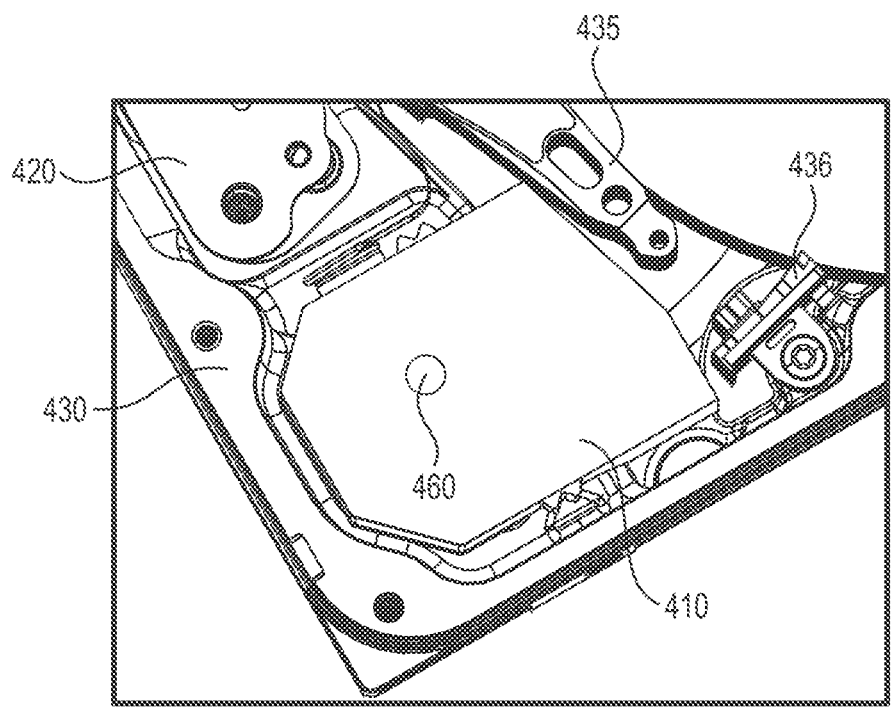
Figure 4D:
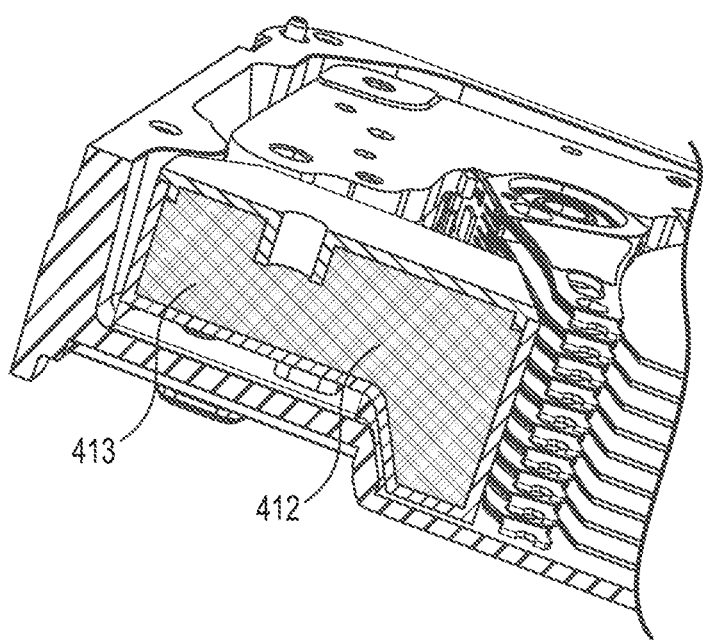

FIG. 4C is another partial view of the expanded Environmental Control Module (ECM) 410 in the corner of the Hard Disk Drive (HDD) 400 between the Voice Coil Motor (VCM) magnet 420 and the Ramp 436. The ECM 410 sits atop the Printed Circuit Connector (PCC) cable bulkhead (not visible). This expanded ECM 410 has internal volume suitable for containing either an active or passive oxygen generating system. The oxygen generator would be installed within the ECM. As shown in FIG. 4D, the oxygen generator is a solid composition 412 that passively generates a gaseous oxidizing agent component In this embodiment, oxygen can be vented from the part 460 through an aperture covered by permeable membrane 416 shown on the top of the ECM.

The PCC bulkhead contains many electrical conduits to bring power to the VCM 420 and to allow passage of electrical signals between the recording heads and the HDD external environment. It could allow electrical power to be conducted to an active oxygen generator system in ECM 410.

FIG. 4D shows a cross-sectional view ECM 410. As shown, the black volume is the available internal volume for an oxygen generator 412 as well as desiccant 413 for HDD internal humidity control.

Alternatively, a container according to the present disclosure (e.g., vial, capsule, etc.) could be placed a wide variety of other locations within a HDD besides the ECM. For example, as shown in FIG. 4A, a container could be placed in a cavity such as cavity 470. A cavity such as cavity 470 may already be present in base 430 (e.g., to manage the mass of cast in the corner area). As mentioned above, containers according to the present disclosure can contain a composition that generates a gaseous oxidizing agent component and/or that can be filled (and pressurized) with a gaseous oxidizing agent component.

Figure 5:
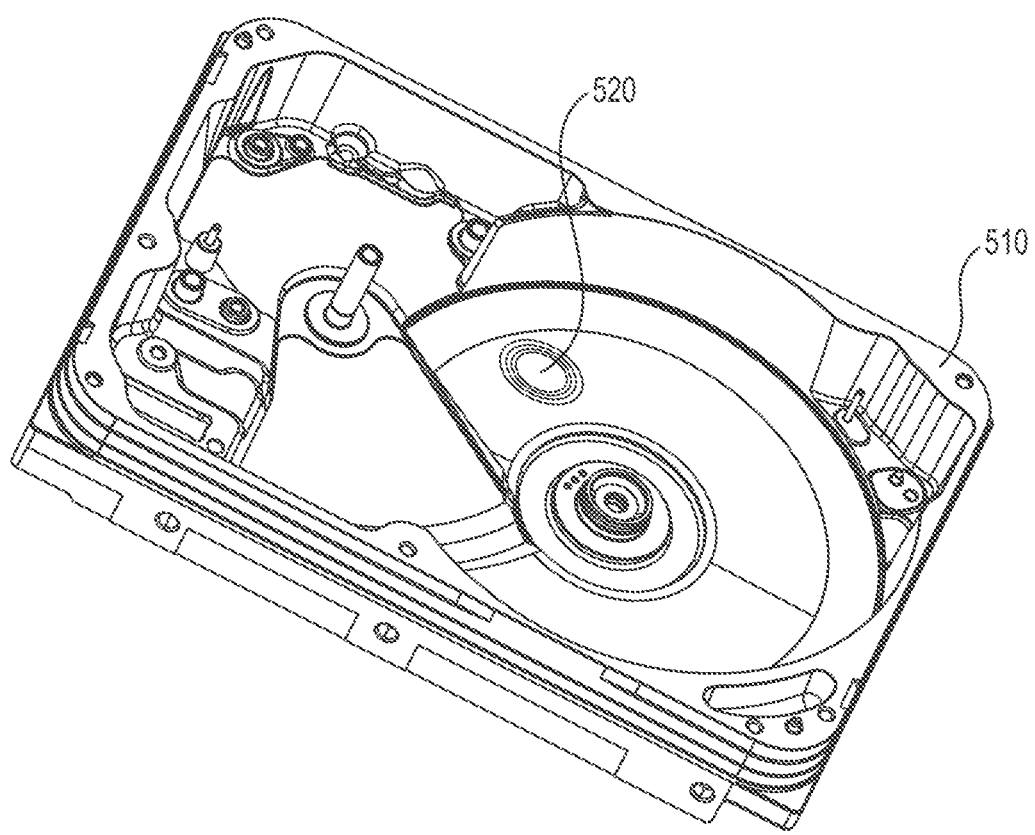
FIG. 5 illustrates another non-limiting embodiment according to the present disclosure of including a composition that can generate a gaseous oxidizing agent component into a hard disk drive.

FIG. 5 illustrates another non-limiting embodiment according to the present disclosure of including a composition that can generate a gaseous oxidizing agent component into a hard disk drive. As shown in FIG. 5, the base 510 of a HDD is shown with the top cover, ECM, and disk pack removed. The floor of base 510 may include a small well that is under the disk pack. The well can include an oxygen generation system such as an electrochemical cell to generate oxygen similar in a form similar to a watch battery. As shown, a permeable membrane 520 is on top of the cell for oxygen out-flux. Electrical leads at the bottom of the cell (not shown) can be potted into the base 510 for a gas-tight seal.

Figure 6:
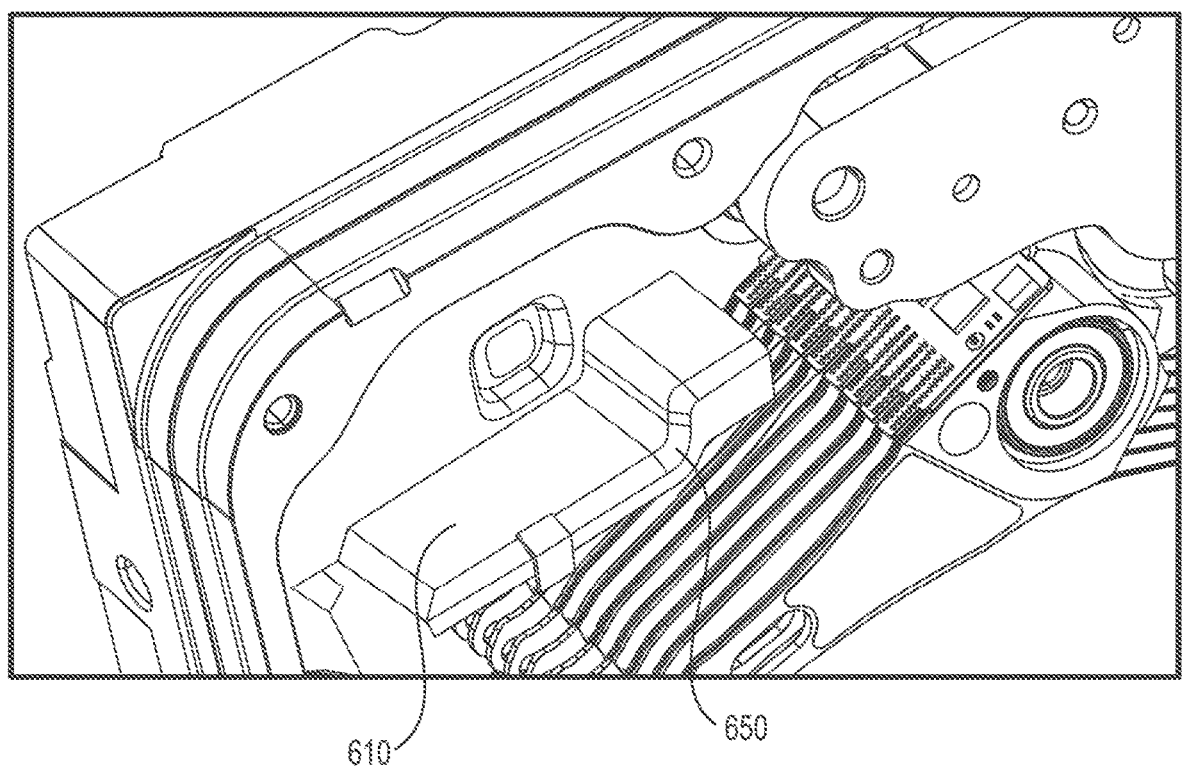
FIG. 6 illustrates another non-limiting embodiment according to the present disclosure of including a composition that can be actively controlled to generate a gaseous oxidizing agent component into a hard disk drive.

FIG. 6 illustrates another non-limiting embodiment according to the present disclosure of including a composition that can be actively controlled to generate a gaseous oxidizing agent component into a hard disk drive. As shown in FIG. 6, a thin-film electrochemical oxygen generator cell 610 attached to the back side of the vertical wall 650. An extension of the flex connector feeds the cell with electrical power. ECM removed for clarity.

Figure 7A:
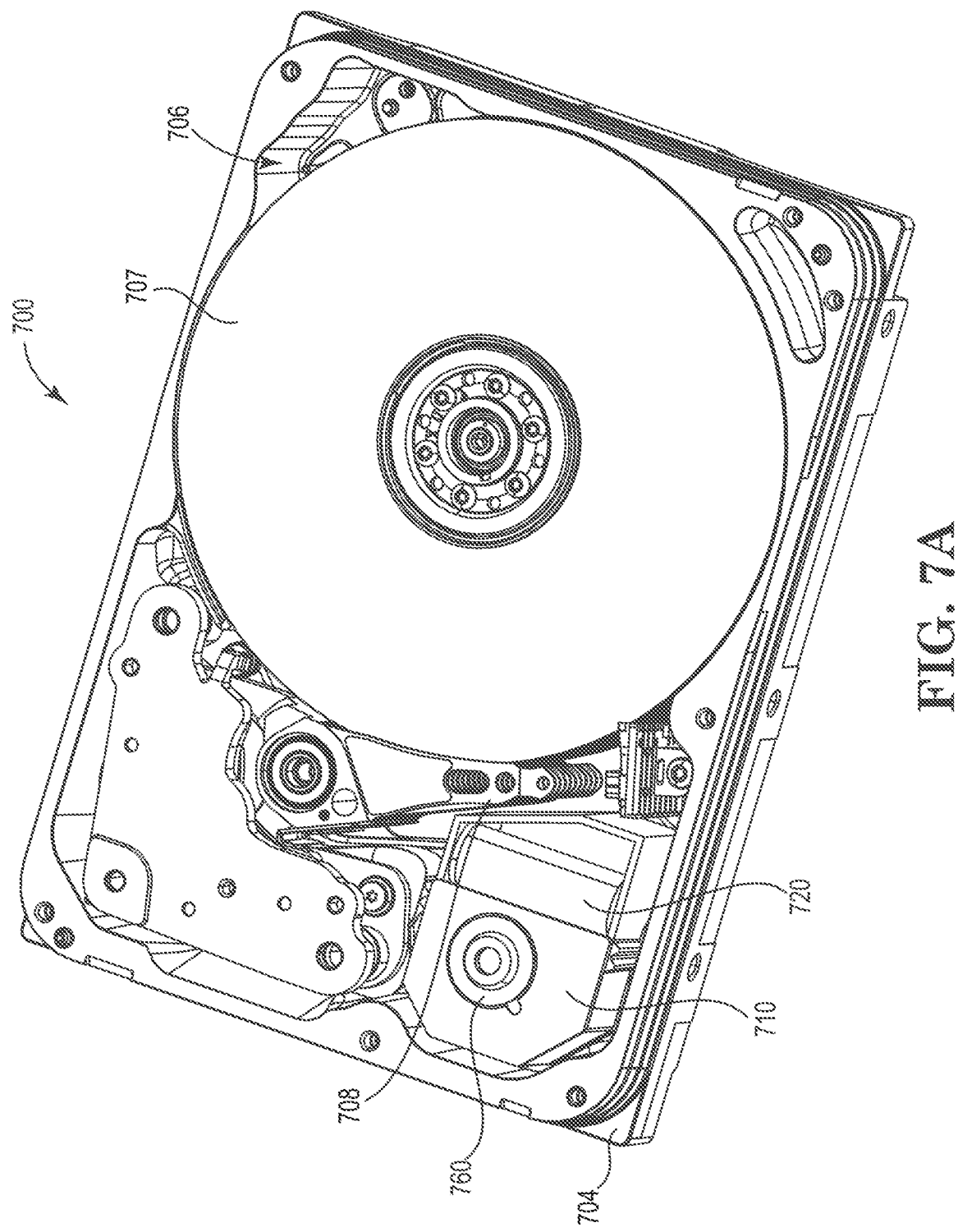
FIGS. 7A-7N illustrate another non-limiting embodiment according to the present disclosure of including a composition that can be actively controlled to generate a gaseous oxidizing agent component in a hard disk drive.
Figure 7B:
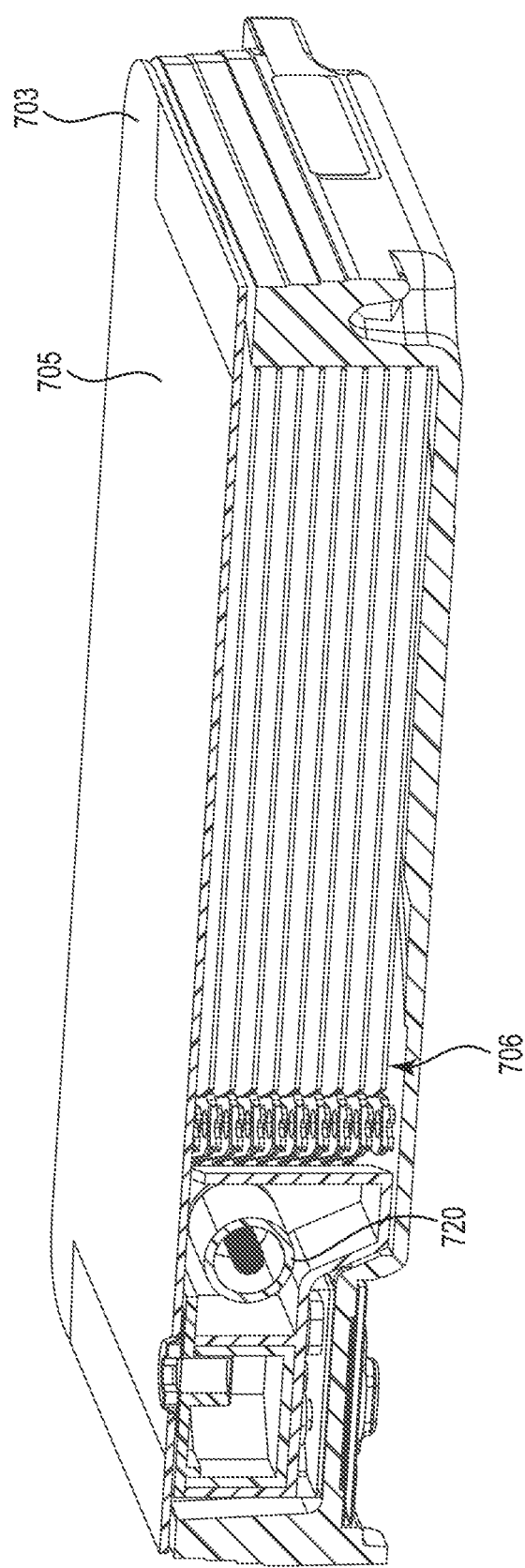
Figure 7C:
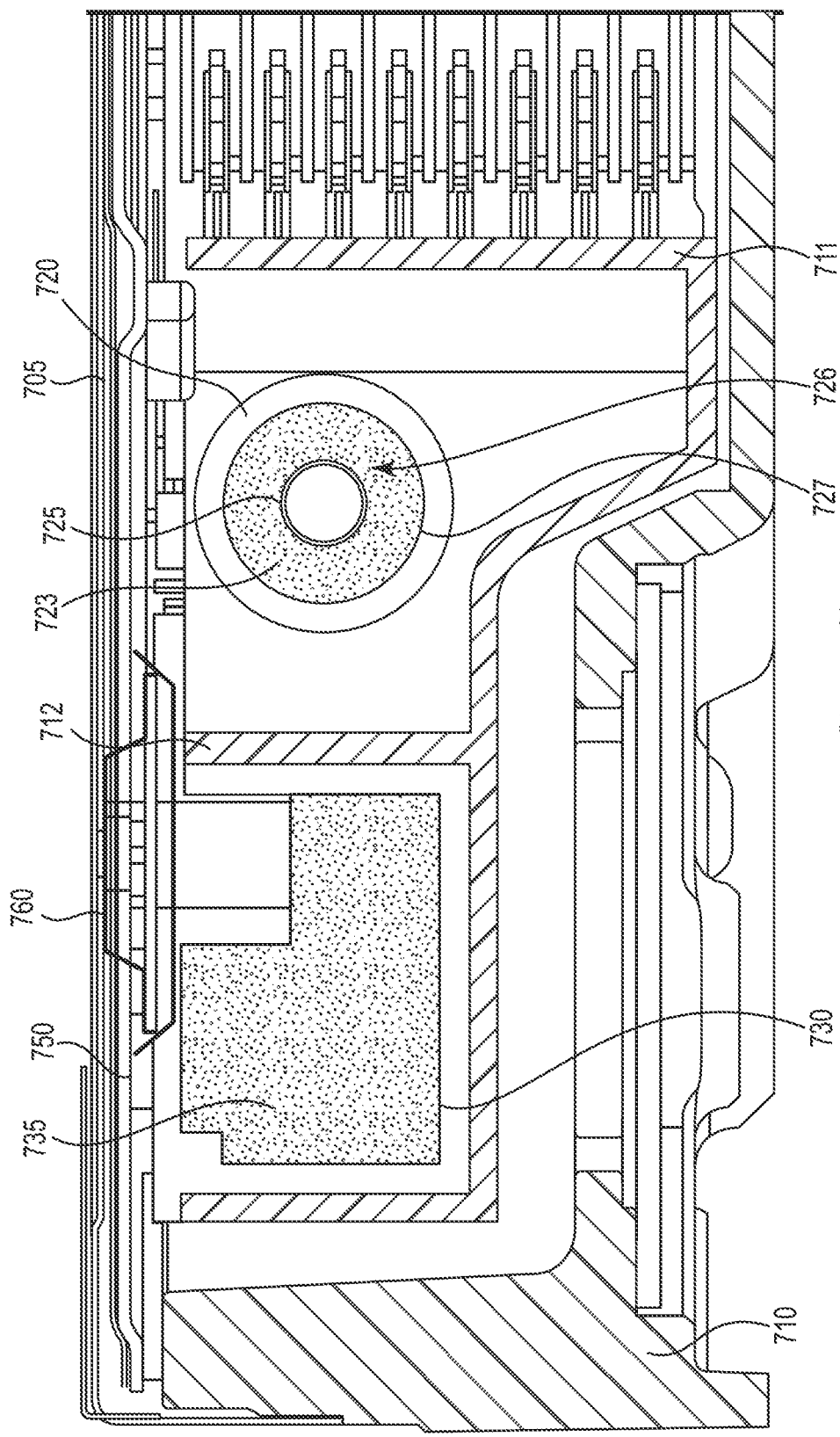
Figure 7D:
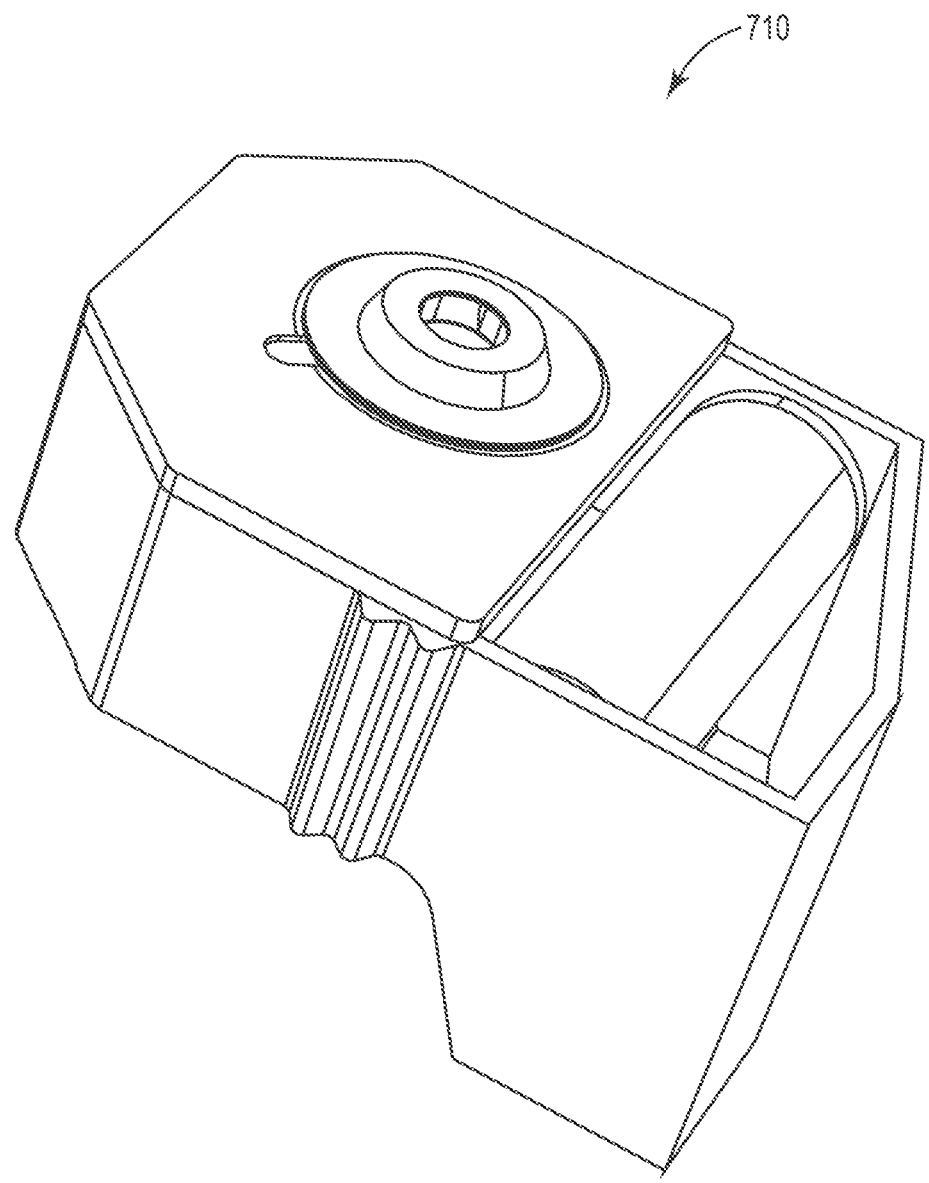
Figure 7E:
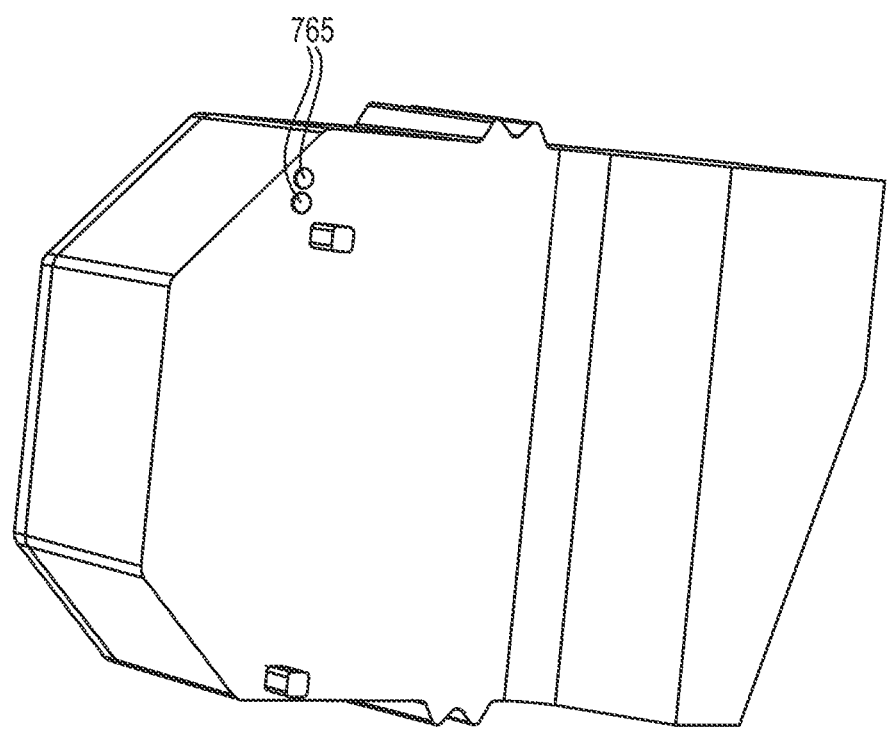
Figure 7F:
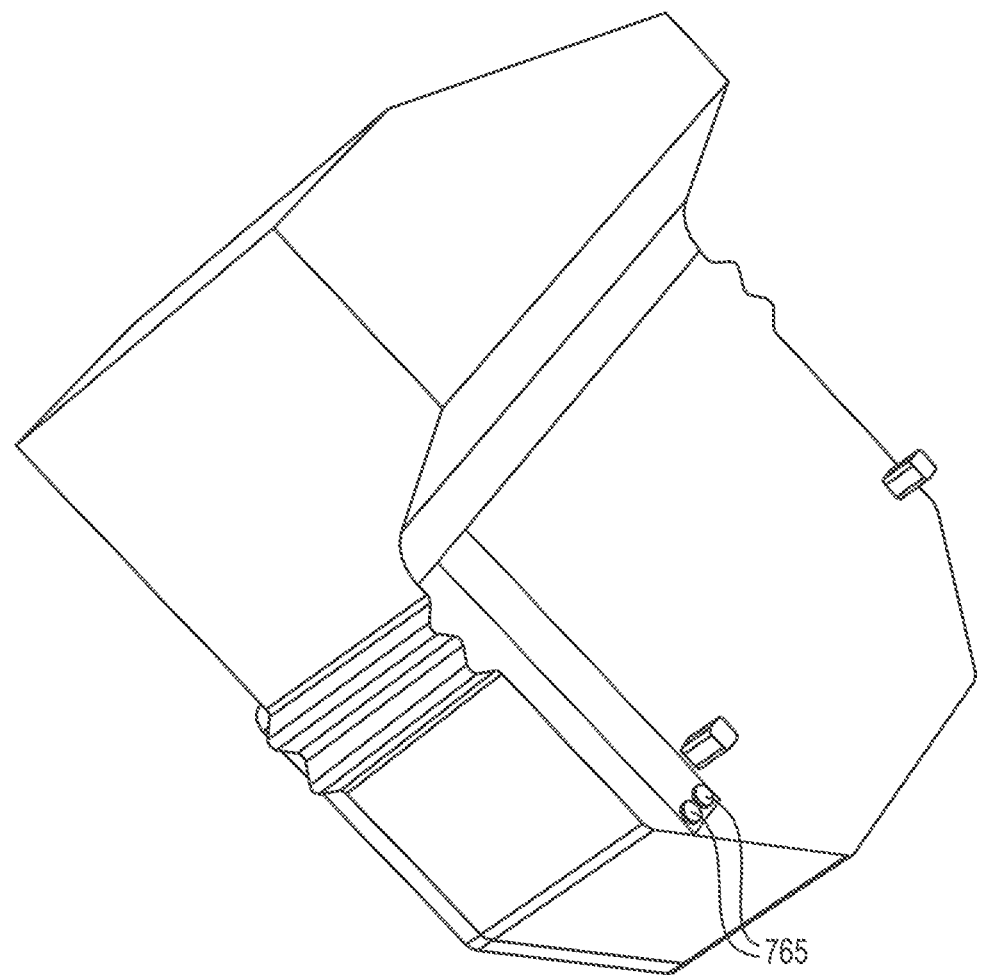
Figure 7G:
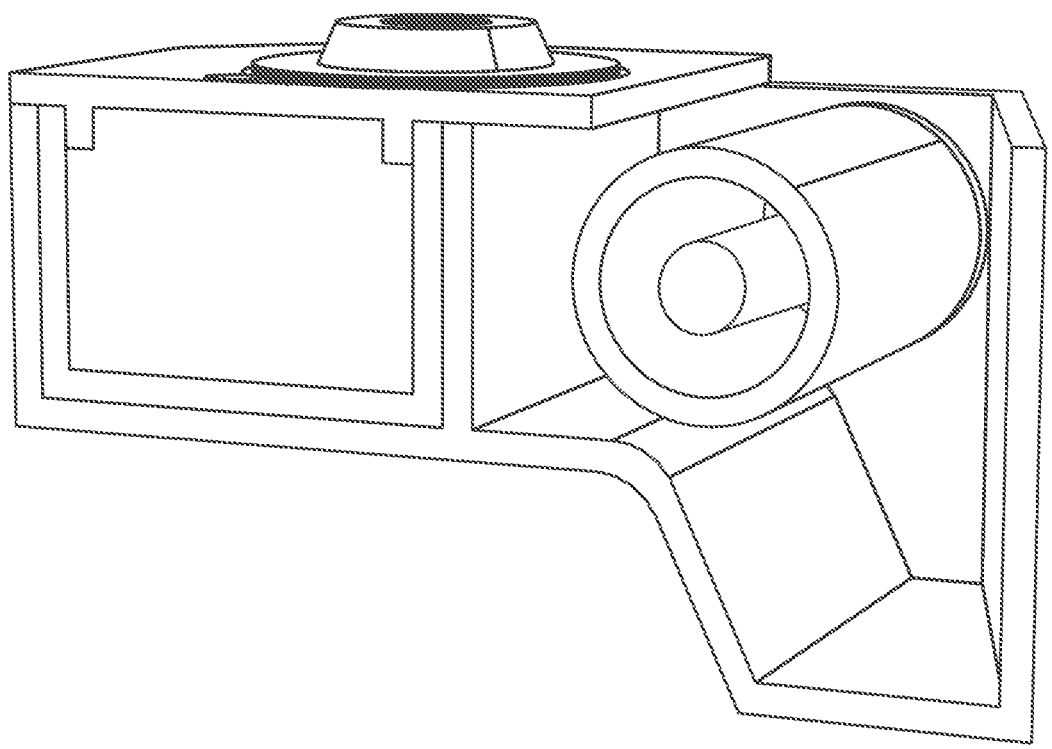
Figure 7H:
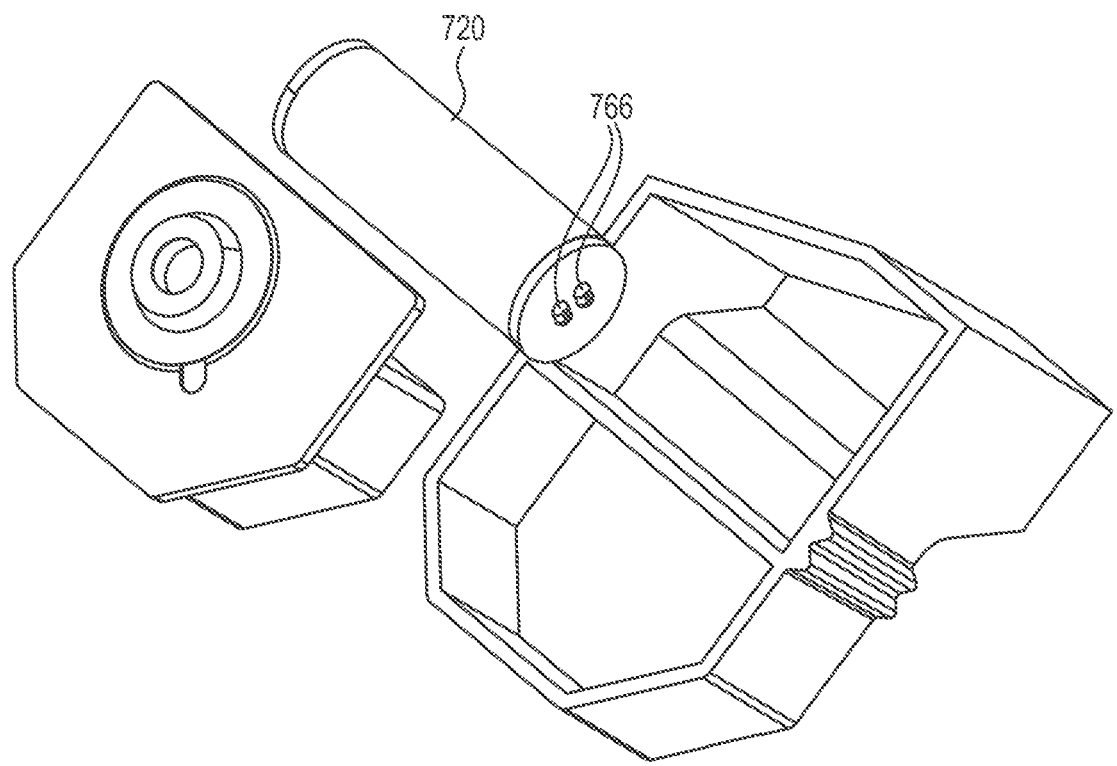
Figure 7I:
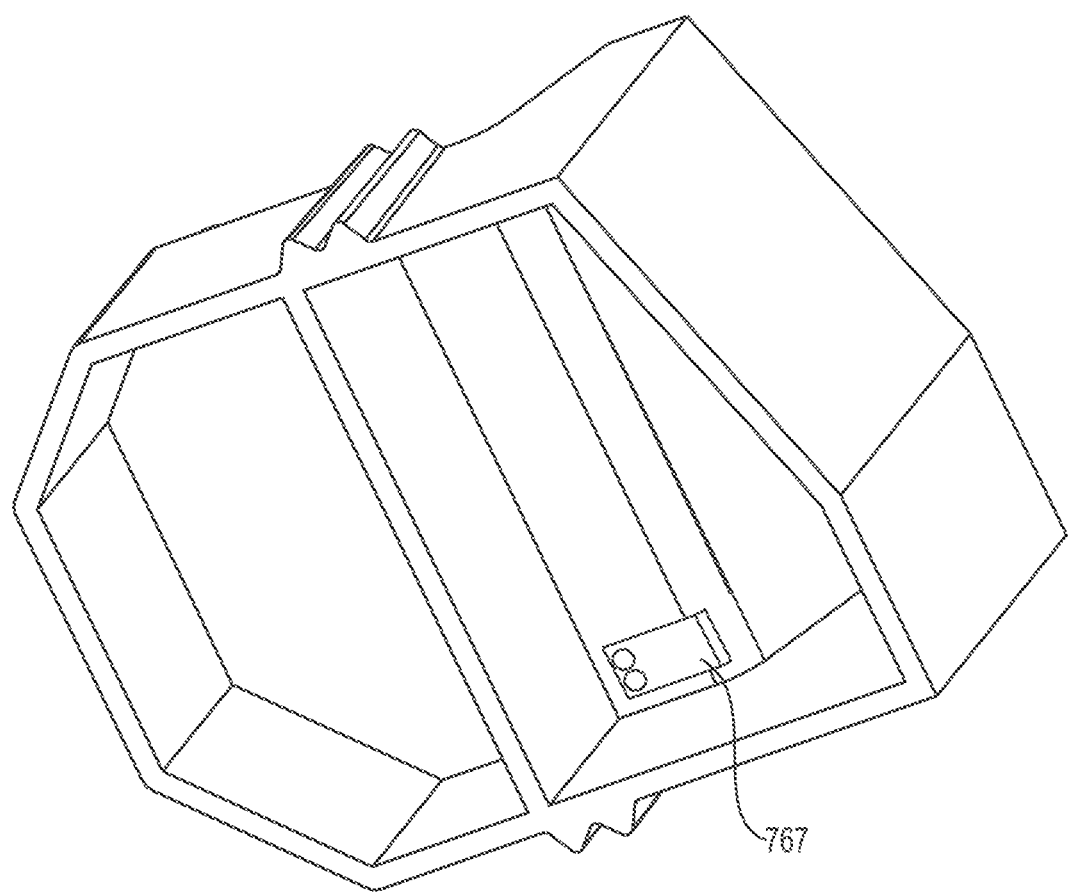
Figure 7J:
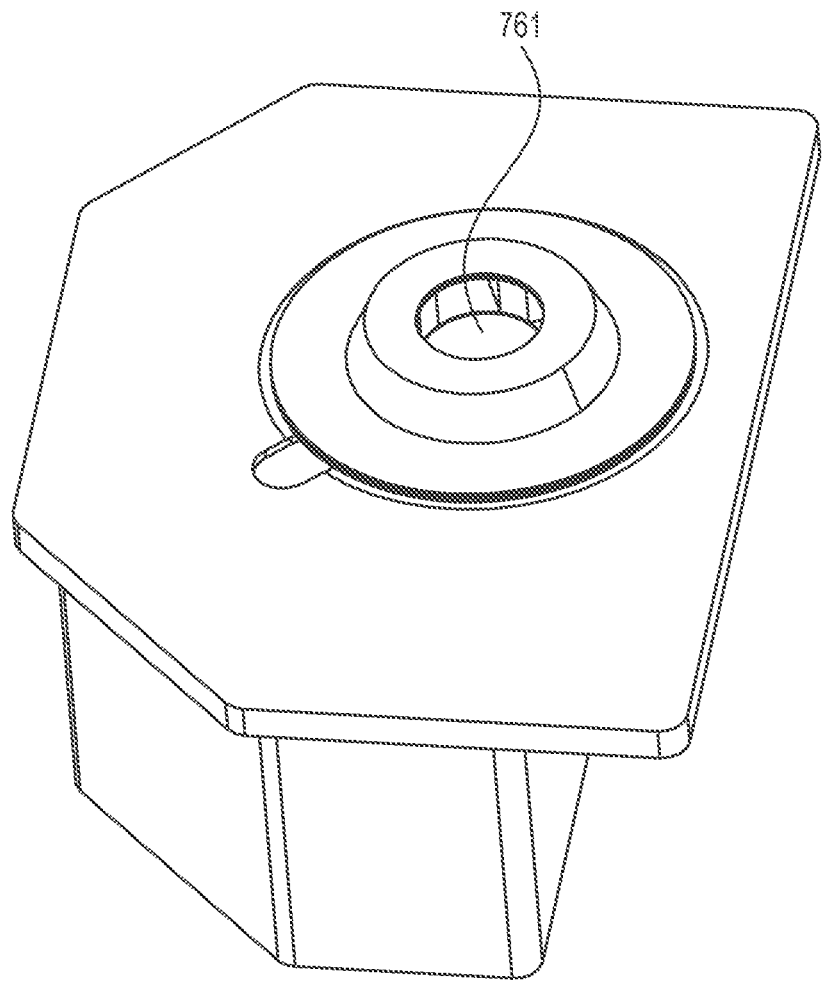
Figure 7K:
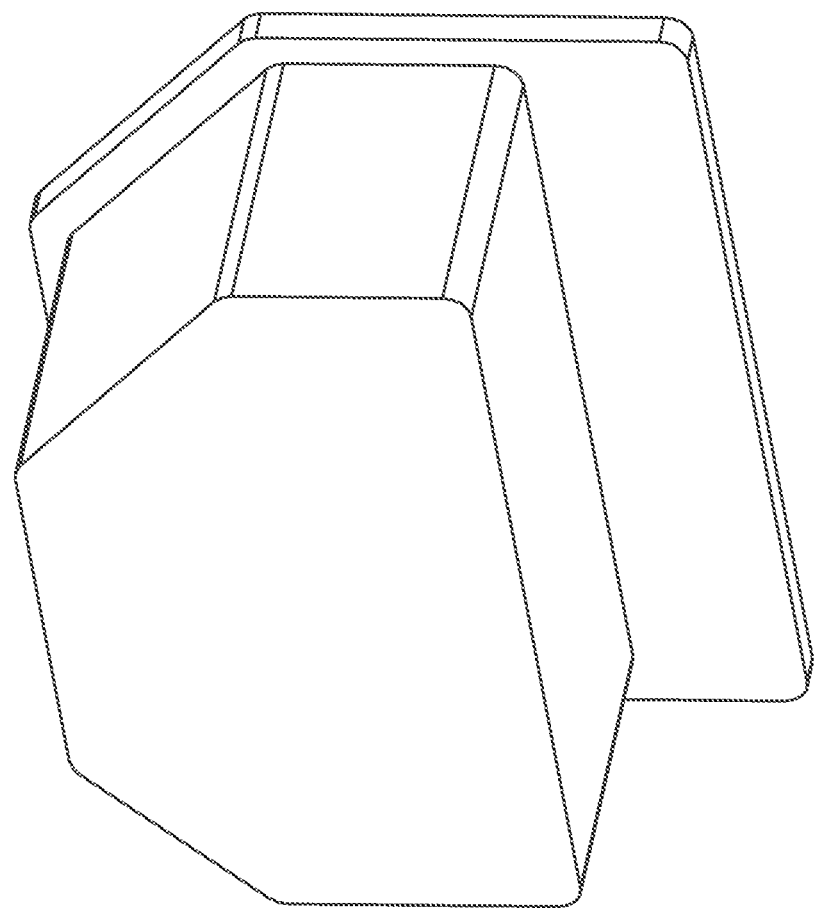
Figure 7L:
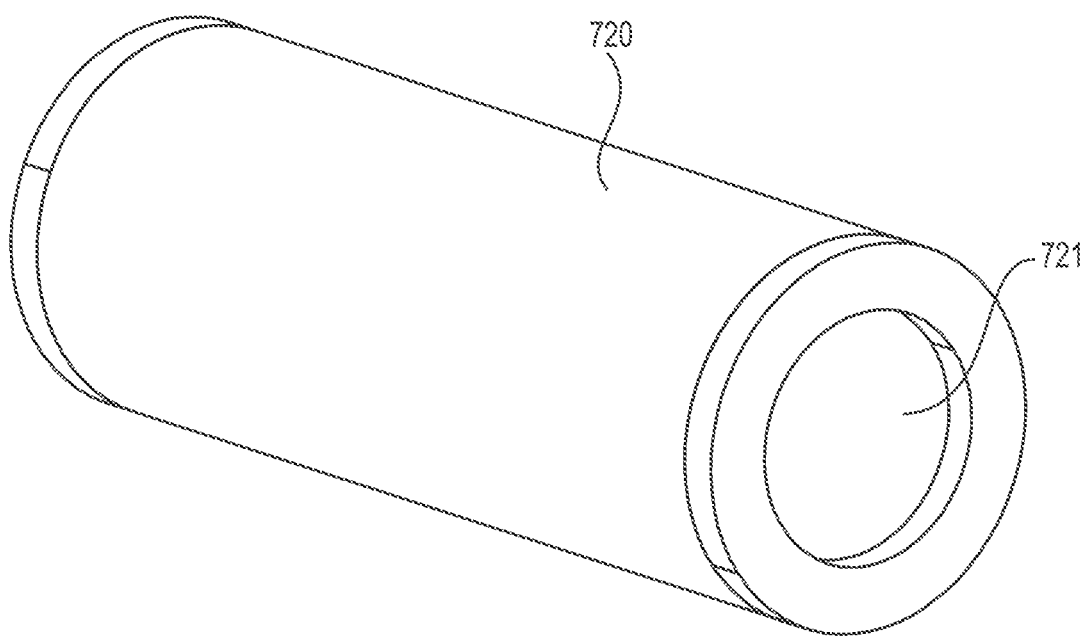
Figure 7M:
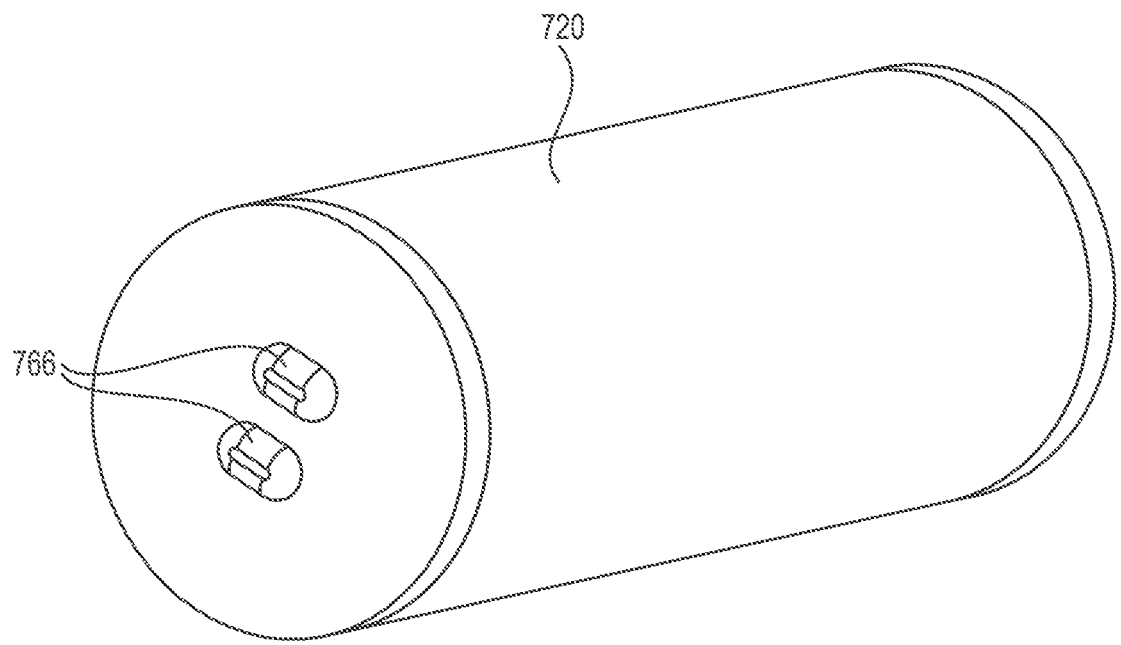
Figure 7N:
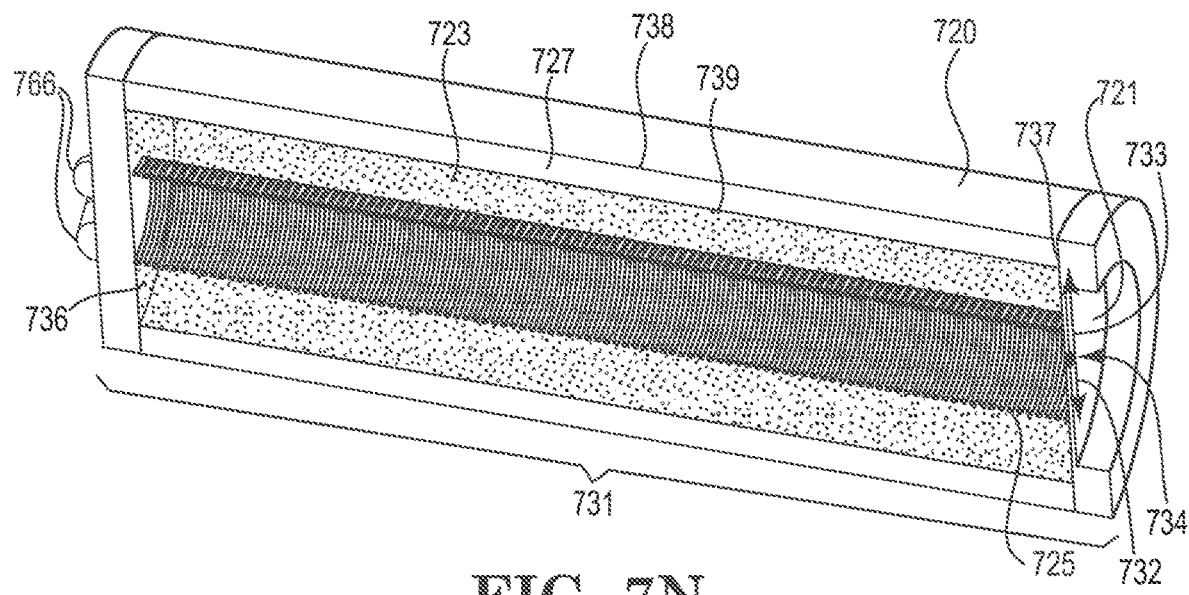

FIGS. 7A-7N illustrate another non-limiting embodiment according to the present disclosure of including a composition that can be actively controlled to generate a gaseous oxidizing agent component in an electronic device such as a hard disk drive.

FIGS. 7A and 7B show an electronic device 700 (as shown a hard disk drive (HDD)) having a housing 703 defined by base 704 and top cover 705, thereby defining an interior gas space 706. Electronic device 700 includes one or more electronic components (e.g., disk media 707 and actuator arm 708) disposed within the housing 703.

FIG. 7A shows an isometric view of electronic device 700 with the oxygen generator/ECM assembly 710 installed. The top cover of the HDD 700 is removed for illustration purposes. The ECM frame can anchor onto PCC Bulkhead (underneath the ECM) with pins. As discussed below, the ECM 710 contains desiccator 735 and an generating device 720 that includes a composition (e.g., zinc peroxide) that can generate a gaseous oxidizing agent component. Electrical power can be routed through the ECM frame from the PCC to the heater assembly/device 720. As discussed below, heater device 720 includes a helical heating coil and has a metallized, gas-tight seal to keep the composition (e.g., zinc peroxide) dry at least until use.

FIG. 7B shows a cross-sectional view of the electronic device 700 through the ECM 710 and with a HDD top cover 705 installed.

FIG. 7C shows a close-up of the view in FIG. 7B.

The ECM 710 includes an ECM outer frame 711 and an inner wall 712 to separate the desiccator module 730 from the heater device 720. The inner wall 712 can help insulate the desiccator module 730 from the heater device 720 so that the desiccator module 730 is not heated to an undue degree, thereby causing moisture to transfer out of the desiccant 735. The ECM 710 is held in place vertically with the assistance of the top cover 705 gasket bead 750. The ECM 710 also includes a circular inlet diffuser filter 760 that aligns with a helium fill hole and filters incoming gas when filling the drive during assembly.

As shown, the desiccator module 730 is a discrete unit that can slip fits into ECM frame 711 and inner wall 712. Alternatively, desiccator module 730 could be an integral with the ECM frame 711. As mentioned, desiccator module 730 contains desiccant for relative humidity (RH) control. Desiccator module 730 can also contain activated carbons for volatile organic compound (VOC) control.

Heater device 720 includes a composition 723 that can actively generate a gaseous oxidizing agent component. Generating device 720 is configured to actively cause the composition 723 to generate the gaseous oxidizing agent component. Generating device 720 also includes one or more heating elements 725 in thermal contact with the composition 723, where the one or more heating elements are in electrical communication with a power source (e.g., like PCC 450 in FIG. 4B) that is configured to apply power to the one or more heating elements 725 to resistively heat the elements and transfer the heat to the composition 723 and heat it to a temperature that causes the composition to generate the gaseous oxidizing agent component. FIG. 7D shows an isometric top view of the whole oxygen generator ECM assembly 710.

FIG. 7E shows an isometric bottom view of the whole oxygen generator ECM assembly 710 illustrating electrical contacts 765, which can mate with corresponding ones on the PCC bulkhead.

FIG. 7F shows another isometric bottom view of the whole oxygen generator ECM assembly 710 illustrating electrical contacts 765, which can mate with corresponding ones on the PCC bulkhead.

FIG. 7G shows a cross-sectional view of the whole oxygen generator ECM assembly 710.

FIG. 7H shows an exploded view of the whole oxygen generator ECM assembly 710 including electrical contacts 766 on heater module 720.

FIG. 7I shows an isometric top view of the ECM frame 711 that will hold both the desiccator module 730 and the oxygen generator module 720. It will reside in the HDD atop the PCC bulkhead. The structure 767 is a flex circuit to conduct electrical power to the oxygen generator 720.

FIG. 7J is an isometric view of the top of the desiccator module 730. As shown, it is a gas-tight box with a soft aluminum seal that hold the desiccant. The seal helps keep the desiccant dry on the manufacturing floor. The desiccator is activated by breaking the seal 761.

FIG. 7K is an isometric view of the bottom of the desiccator module 730. FIG. 7L is an isometric view of one end of the heater module 720.

FIG. 7M is an isometric view of the other end of the heater device 720 having the electrical contacts 766.

FIG. 7N is a cross-sectional view of the generating device/heater module 720, which is considered a relatively, high aspect ratio oxygen generator device.

The composition 723 can be loose in a container or in a form of a three-dimensional shape such a sphere, cylinder, square, and the like. As shown in FIG. 7N, composition 723 is in the form of a hollow cylinder having a length 731, an inner radius 732, an outer radius 733, a reference center 734, a first end 736, and a second end 737.

As mentioned, generating device 720 includes one or more heating elements 725 in thermal contact with the composition 723. As shown, the one or more heating elements 725 are in the form of a helical coil 725 surrounded by an oxygen generating solid such as zinc peroxide. Coil 725 has ends that correspond to the ends of the composition 723. That is, a first end 736 and a second end 737 opposite the first end. As shown, the coil 725 includes electrical power contacts 766 located on the first end 736.

On the second end 737 is an oxygen permeable membrane 721 (e.g., a polytetrafluoroethylene (PTFE) membrane) to permit at least oxygen gas to transfer out of device 720 as the oxygen is generated, out of ECM assembly 710 and into interior gas space 706 of electronic device 700. Membrane 721 may also be selected to permit the transfer of one or more other gases therethrough and, optionally, not permit transfer of particles therethrough so as to prevent any particles transferring from inside device 720 into the interior gas space 706 to avoid any undue particle contamination. Generating device 720 can include thermal insulation to help insulate the interior of device 720 relative to the rest of ECM assembly 710 and/or relative to the interior gas space 706 of electronic device 700. Providing the generating device 720 with insulation can help manage power supply and consumption of electronic device 700 (e.g., reduce power that is supplied to heat the composition to generate a gaseous oxidizing agent component) and/or manage the temperature profile of composition 723. Managing the temperature profile of the composition 723 can help manage the consumption of the composition 723 and/or heat-of-reaction generated thereby. Managing the consumption of composition 723 can help avoid premature consumption due to, e.g., undue temperature increases at one or more points throughout the composition 723.

In some embodiments, the generating device 720 can include a housing that has thermal insulation properties to insulate the composition 723 relative to one or more other portions of electronic device 700. As shown in FIG. 7N, generating device 720 includes housing 727 that has thermal insulating properties. Non-limiting examples of providing housing 727 with thermal insulation properties include ceramic housing materials (e.g., film), plastic housing materials (e.g., film), and/or creating a space in housing 727 and introducing thermal insulating materials (e.g., one or more of vacuum, plastic materials such as beads, or ceramic materials such as beads) into said space. In some embodiments, housing 727 can be film or a hollow structure having a first (inner) wall and a concentric, second (outer) wall defining a space therebetween that can be filled with thermally, insulating beads and/or a have a vacuum. For example, 727 can schematically represent a film having thickness from one side 738 to another side 739.

Alternatively, housing 727 can schematically represent hollow structure having a first (inner) wall 738 and a concentric, second (outer) wall 739 defining a space therebetween that can be filled with thermally, insulating beads and/or a have a vacuum. Also, as shown, housing 727 of generating device 720 is disposed within environmental control module 710.

In more detail, as shown in FIG. 7N, housing 727 has helical coil 725 disposed therein to define an interior space 726 between the housing 727 and the coil 725. At least a portion (e.g., all) of the interior space 726 can be filled with composition 723 that can generate a gaseous oxidizing agent component (e.g., zinc peroxide) so that the composition 723 can be in thermal contact with coil 725 and be thermally heated as desired.

Figure 8:
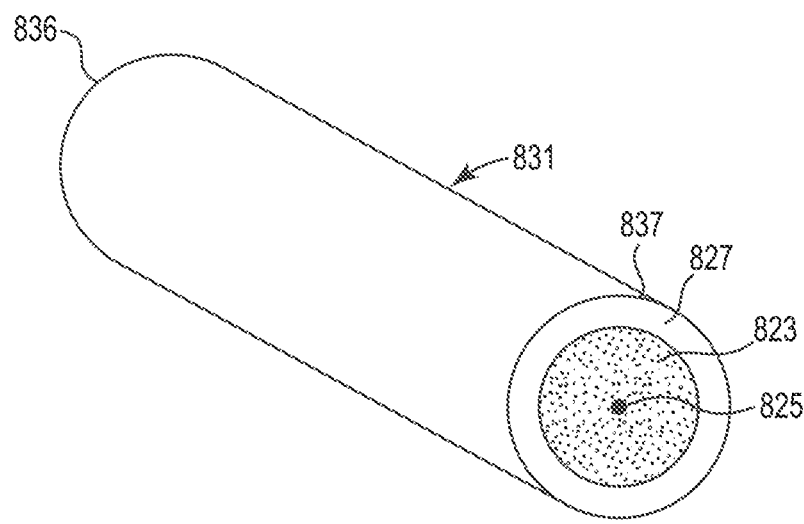
FIG. 8 shows a partial, cross-sectional, perspective schematic of an alternative embodiment of the generating device shown in FIG. 7N.
Figure 9:
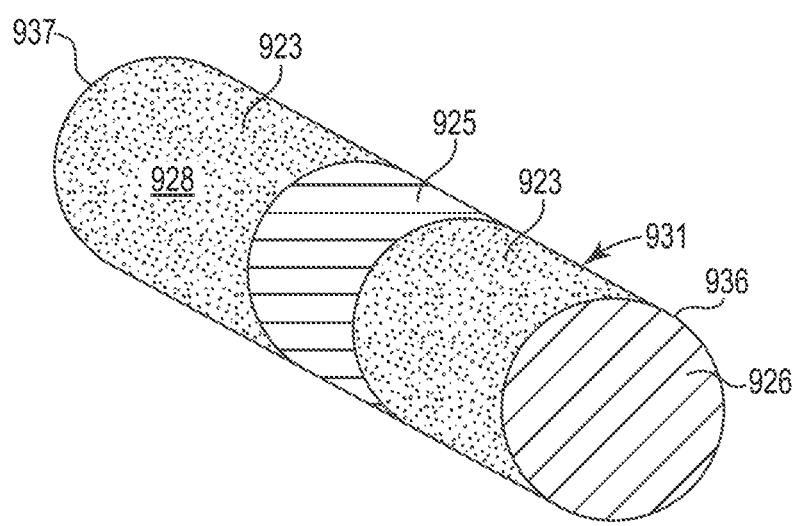
FIG. 9 shows a partial, cross-sectional, perspective schematic of another alternative embodiment of the generating device shown in FIG. 7N.
Figure 10:
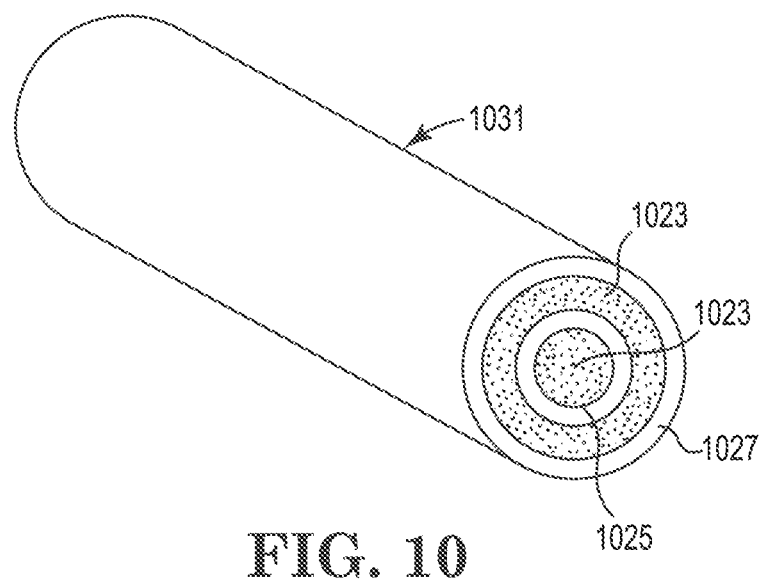
FIG. 10 shows a partial, cross-sectional, perspective schematic of another alternative embodiment of the generating device shown in FIG. 7N.

FIGS. 8-10 show alternative embodiments of a generating device according to the present disclosure. The generating devices can be selected and/or modified based on one or more criteria such as temperature profile (e.g., uniformity) of the composition that can actively generate a gaseous oxidizing agent component when heated, heat loss from the one or more heating elements and/or composition, and/or the power supply to achieve a given temperature profile of the composition.

FIG. 8 shows an alternative embodiment of a generating device according to the present disclosure, where one or more heating elements include one or more electric wires 825 that can be heated resistively and that are centrally disposed within a composition 823 that is in the form of a cylinder having a length 831, a first end 836 and a second end 837. The length of the wires 825 can be selected as desired and can extend along the entire length 831 of the composition or as one or more discrete and discontinuous portions thereof. As shown, thermally insulating housing 827 is similar to housing 727 discussed above and can be located around the composition 823 in a thermally insulating manner. Because the one or more electric wires 825 are a heat source centrally located within the composition, heat tends to radiate outward, which can reduce heat loss in some embodiments.

FIG. 9 shows another alternative embodiment of a generating device according to the present disclosure, with no outer housing like 727 shown for illustration purposes and with one or more heating elements located on the exterior surface of composition 923. As shown in FIG. 9 the one or more heating elements include at least one heating element 925 disposed along at least a portion of the exterior surface 928 of the length 931 and/or a heating element 926 at the exterior surface 928 of the first end 936. The length of the heating element 925 can be selected as desired and can extend along the entire length 931 of the composition or as one or more discrete and discontinuous portions thereof. In some embodiments, as shown, one or more heating elements 925 extend over only a portion of the length 931, which can help manage power consumption while at the same time provide desired temperature profile within the composition 923 so as to control the reaction that generates gaseous oxidizing agent component when heated. Heating elements located on the external surface of composition 923 can also facilitate manufacturing of the corresponding generating device. Although not shown in FIG. 9, a thermally insulating similar to housing 727 discussed above can be located around the composition 923 in a thermally insulating manner.

FIG. 10 shows another alternative embodiment of a generating device according to the present disclosure, with one or more heating elements located/distributed within the composition 1023. The embodiment shown in FIG. 10 can be considered a hybrid of the embodiments shown in FIGS. 8 and 9. In more detail, as shown in FIG. 10, one or more heating elements include at least one heating element 1025 disposed along at least a portion of the length 1031 with composition 1023 located on either side of the electrical heating element 1025. The length of the one or more heating elements 1025 can be selected as desired and can extend along the entire length 1031 of the composition or as one or more discrete and discontinuous portions thereof. In some embodiments, as shown, one or more heating elements 1025 extend over only a portion of the length 1031, which can help manage power consumption and heat loss while at the same time provide desired temperature profile within the composition 923 so as to control the reaction that generates gaseous oxidizing agent component when heated. As shown, thermally insulating housing 1027 is similar to housing 727 discussed above and can be located around the composition 1023 in a thermally insulating manner.

In some embodiments, a generating device can include a heating element from a dispersed phase of electrically conducting material, which can help provide desirable temperature uniformity to the oxygen generating composition. Non-limiting examples of such electrically conducting material includes wire wool and metal foam. The oxygen generating material (e.g., zinc peroxide) can be present in the interstices. This way, the oxygen generating material can be in close proximity to the heating surface, thereby facilitating relatively uniform oxygen production and release. The density and structure of the electrically conducting material can be provided such that there is a continuous electrical conduction path through the heater module. For example, a hollow housing similar to module 727 could be packed with a dispersed phase of electrically conducting material and a composition that can generate a gaseous oxidizing agent component within its interstices. Electrical terminals could be present so that electrical current could be passed through the housing/module thereby heating the composition as desired.

Active oxygen production additionally allows for the option of providing an input measurement of oxygen concentration to determine how much oxygen production is needed to maintain the desired oxygen concentration. This input measurement could be provided by a sensor that detects the concentration of the gaseous oxidizing agent component in the interior gas space (e.g., a pressure sensor or oxygen molarity sensor within an electronic device such as a HDD). In some embodiments, an electronic device includes a) a sensor that measures the concentration of the gaseous oxidizing agent component in the interior gas space; and b) a controller in electrical communication with the sensor and the generating device. The controller provides instructions to the generating device based on the measured concentration of the gaseous oxidizing agent component in the interior gas space to control the concentration of the gaseous oxidizing agent component in the interior gas space. In some embodiments, a method of generating a gaseous oxidizing agent component in an electronic device includes a) measuring the concentration of gaseous oxidizing agent component an interior gas space of an electronic device; b) comparing the measured concentration of gaseous oxidizing agent component to a predetermined range of concentration of gaseous oxidizing agent component; and if the concentration is below the predetermined range then c) actively generating gaseous oxidizing agent component within the interior gas space of the electronic device if the measured concentration is below a predetermined value of concentration of gaseous oxidizing agent component. If the concentration is above the predetermined range then do nothing. After a predetermined period of time has passed, the process can be repeated.

It is noted that monitoring at a given time interval for one set of conditions can produce different results if one or more conditions change. For example, if the oxygen consumption occurs at a slower rate for a given time interval, then the oxygen concentration may be within acceptable limits when monitored, but fall outside acceptable limits shortly after being monitored, thereby causing the oxygen concentration to become unacceptably low before the next monitoring begins. According to the present disclosure, a secondary check feedback (from a sensor such as pressure, temperature and/or relative humidity besides oxygen concentration measurement) can be used for feedback control. If desired, the time interval for monitoring can be adjusted accordingly as well.

Figure 11:
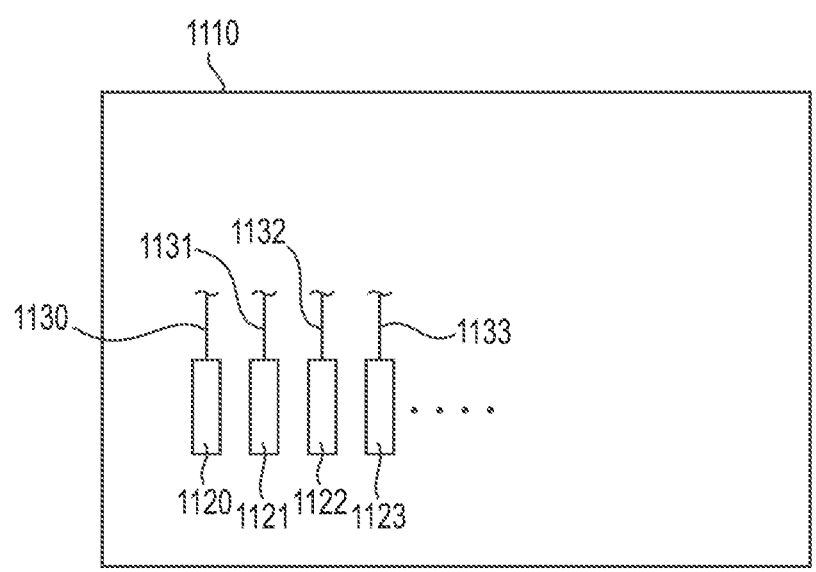
FIG. 11 shows a partial, cross-sectional, perspective schematic of another non-limiting embodiment according to the present disclosure of including a composition that can be actively controlled to generate a gaseous oxidizing agent component in a hard disk drive.

In some embodiments, a composition that can actively generate a gaseous oxidizing agent component can be provided in "single-use" structures that are separate and discrete from each other and can be independently activated to generate a desired quantity of oxygen. Each structure can be a single use structure in that it completely consumes the composition after being activated and is not used afterwards. The quantity and size of such single use structures can be selected to provide desired oxygen concentration throughout the service life of an electronic device or be used in combination with one or more other sources of oxygen. A non-limiting example of such single use structures is shown in FIG. 11. FIG. 11 shows a container 1110 such an environmental control module that includes a plurality of heating elements and a plurality of discrete structures 1120, 1121, 1122, 1123, etc. Each discrete structure includes a composition that can actively generate a gaseous oxidizing agent component that is in thermal contact with at least one of the plurality of heating elements 1130, 1131, 1132, 1133, respectively, such as wires. Each of the at least one of the plurality of heating elements is in electrical communication with a power source. A corresponding generating device is configured to independently apply power to the at least one of the plurality of heating elements of each discrete structure to heat the composition to a temperature that causes the composition to generate the gaseous oxidizing agent component.

What is claimed is:

1. An electronic device comprising:
    a) a housing having an interior gas space;
    b) one or more electronic components disposed within the housing;
    c) a composition that can actively generate a gaseous oxidizing agent component, wherein the composition comprises a stabilizer that can slow down the generation of the gaseous oxidizing agent, wherein the composition comprises one or more compounds that can actively decompose to generate the gaseous oxidizing agent component, and wherein the stabilizer comprises a coating on at least one of the one or more compounds; and
    d) a generating device configured to actively cause the composition to generate the gaseous oxidizing agent component.

2. The electronic device of claim 1, wherein the stabilizer is chosen from a one or more phosphate salts, one or more phosphate analogues, one or more ethylene oxide oligomers, one or more ethylene oxide polymers, and combinations thereof.

3. The electronic device of claim 1, wherein the composition comprises a compound chosen from calcium peroxide, magnesium peroxide, barium peroxide, zinc peroxide, silver oxide, cadmium peroxide, strontium peroxide, lithium peroxide, sodium peroxide, potassium peroxide, lithium nickel peroxide, potassium superoxide, sodium percarbonate, potassium percarbonate, calcium percarbonate, magnesium percarbonate, sodium perborate, potassium perborate, calcium perborate, magnesium perborate, potassium permanganate, sodium persulfate, potassium persulfate, and other peroxyhydrate salts such as potassium pyrophosphate peroxyhydrates and sodium sulfate-hydrogen peroxide-sodium chloride adduct, and mixtures thereof.

4. An electronic device comprising:
a) a housing having an interior gas space;
b) one or more electronic components disposed within the housing;
c) a composition that can actively generate a gaseous oxidizing agent component; and
d) a generating device configured to actively cause the composition to generate the gaseous oxidizing agent component, wherein the generating device comprises one or more heating elements in thermal contact with the composition, wherein the one or more heating elements are in electrical communication with a power source that is configured to apply power to the one or more heating elements to heat the composition to a temperature that causes the composition to generate the gaseous oxidizing agent component.

5. The electronic device of claim 4, wherein the composition is in a form of a three-dimensional shape having an exterior surface, wherein the one or more heating elements are in thermal contact with at least a portion of the exterior surface.

6. The electronic device of claim 5, wherein the three-dimensional shape comprises a cylinder having a length, a radius, a center, a first end, and a second end.

7. The electronic device of claim 6, wherein the one or more heating elements are disposed along at least a portion of the exterior surface of the length and/or at the exterior surface of the first end.

8. The electronic device of claim 7, wherein the one or more heating elements are disposed along only a portion of the exterior surface of the length.

9. The electronic device of claim 6, wherein the composition comprises at least zinc peroxide or silver oxide.

10. The electronic device of claim 6, wherein the one or more heating elements comprise at least one wire disposed in the center and along at least a portion of the length of the cylinder, or wherein the one or more heating elements comprise a coil surrounded by the composition, or wherein the one or more heating elements are distributed within the composition.

11. The electronic device of claim 6, wherein the one or more heating elements comprise a coil having a first end and a second end opposite the first end, wherein the coil comprises electrical power contacts located on the first end.

12. The electronic device of claim 4, wherein the composition is disposed within a housing, wherein the housing comprises at least a first wall and a concentric, second wall defining a space between the first wall and the second wall, wherein the housing is thermally insulating, and, optionally, wherein the housing is disposed within an environmental control module.

13. The electronic device of claim 12, wherein the space comprises a vacuum.

14. The electronic device of claim 4, wherein the generating device comprises a plurality of heating elements and a plurality of discrete structures, wherein each discrete structure comprises composition that can actively generate a gaseous oxidizing agent component that is in thermal contact with at least one of the plurality of heating elements, wherein each of the at least one of the plurality of heating elements is in electrical communication with a power source, and wherein the generating device is configured to independently apply power to each of the at least one of the plurality of heating elements of each discrete structure to heat the composition to a temperature that causes the composition to generate the gaseous oxidizing agent component.

15. The electronic device of claim 4, wherein the composition has been pre-conditioned by a process comprising heating the composition to a temperature that causes the composition to generate a gaseous oxidizing agent component, wherein the heating occurs for a time period that causes an increase in rate of weight loss of the composition for a reference temperature from a first rate of weight loss of the composition to a second rate of weight loss of the composition, wherein the second rate of weight loss is less than a maximum rate of weight loss at the reference temperature, wherein the reference temperature corresponds to a temperature used to heat the composition and generate oxygen during the service life of the electronic device.

16. An electronic device comprising:
a) a housing having an interior gas space;
b) one or more electronic components disposed within the housing;
c) a composition that can actively generate a gaseous oxidizing agent component, wherein the composition comprises a stabilizer that can slow down the generation of the gaseous oxidizing agent, wherein the composition comprises two or more reactants that can react with each other to generate the gaseous oxidizing agent component, and wherein the stabilizer comprises a coating on at least one of the two or more reactants; and
d) a generating device configured to actively cause the composition to generate the gaseous oxidizing agent component.

17. The electronic device of claim 16, wherein the stabilizer is chosen from a one or more phosphate salts, one or more phosphate analogues, one or more ethylene oxide oligomers, one or more ethylene oxide polymers, and combinations thereof.

18. The electronic device of claim 16, wherein at least one reactant comprises at least one peroxide.

19. The electronic device of claim 16, wherein a first reactant is chosen from calcium peroxide, lithium peroxide, sodium peroxide, potassium peroxide, sodium chlorate and mixtures thereof, and wherein a second reactant is chosen from liquid water, gaseous water, gaseous carbon dioxide, solid iron and mixtures thereof.

20. An electronic device comprising:
a) a housing having an interior gas space;
b) one or more electronic components disposed within the housing;
c) a composition that can actively generate a gaseous oxidizing agent component, wherein the composition comprises a stabilizer that can slow down the generation of the gaseous oxidizing agent, wherein the stabilizer comprises one or more ingredients in admixture with one or more compounds that can actively decompose to generate the gaseous oxidizing agent component and/or with two or more reactants that can react with each other to generate the gaseous oxidizing agent component; and
d) a generating device configured to actively cause the composition to generate the gaseous oxidizing agent component.

21. The electronic device of claim 20, wherein the stabilizer is chosen from one or more phosphate salts, one or more carboxylate salts, one or more sulfonate salts, one or more citrate salts, one or more bicarbonate salts, one or more permanganate salts, one or more metal oxides, one or more amides, and combinations thereof.

22. The electronic device of claim 20, wherein the composition comprises a compound chosen from calcium peroxide, magnesium peroxide, barium peroxide, zinc peroxide, silver oxide, cadmium peroxide, strontium peroxide, lithium peroxide, sodium peroxide, potassium peroxide, lithium nickel peroxide, potassium superoxide, sodium percarbonate, potassium percarbonate, calcium percarbonate, magnesium percarbonate, sodium perborate, potassium perborate, calcium perborate, magnesium perborate, potassium permanganate, sodium persulfate, potassium persulfate, and other peroxyhydrate salts such as potassium pyrophosphate peroxyhydrates and sodium sulfate-hydrogen peroxide-sodium chloride adduct, and mixtures thereof.

\* \* \* \* \*

UNITED STATES PATENT AND TRADEMARK OFFICE
CERTIFICATE OF CORRECTION

| | |
|---|---|
| PATENT NO. | : 11,763,853 B2 |
| APPLICATION NO. | : 17/583746 |
| DATED | : September 19, 2023 |
| INVENTOR(S) | : Silvia De Vito Luebben et al. |

It is certified that error appears in the above-identified patent and that said Letters Patent is hereby corrected as shown below:

On the Title Page

Page 2 Column 2 Line 7:
(56) References Cited
FOREIGN PATENT DOCUMENTS
"JP S557164431A 10/1982" should be -JP S57164431A 10/1982-

Signed and Sealed this
Twenty-third Day of April, 2024

Katherine Kelly Vidal
*Director of the United States Patent and Trademark Office*